(12) United States Patent
Furukawa

(10) Patent No.: US 7,576,870 B2
(45) Date of Patent: Aug. 18, 2009

(54) MEASUREMENT APPARATUS, EXPOSURE APPARATUS, AND DEVICE FABRICATION METHOD

(75) Inventor: Yasunori Furukawa, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 109 days.

(21) Appl. No.: 11/971,569

(22) Filed: Jan. 9, 2008

(65) Prior Publication Data
US 2008/0259350 A1 Oct. 23, 2008

(30) Foreign Application Priority Data
Feb. 5, 2007 (JP) ............................. 2007-026071

(51) Int. Cl.
*G01B 11/02* (2006.01)
*G01B 9/02* (2006.01)
(52) U.S. Cl. ...................................... 356/515; 356/521
(58) Field of Classification Search ................. 356/515, 356/521
See application file for complete search history.

(56) References Cited

U.S. PATENT DOCUMENTS

| | | | | |
|---|---|---|---|---|
| 5,196,350 | A * | 3/1993 | Backman et al. | 436/501 |
| 6,118,535 | A * | 9/2000 | Goldberg et al. | 356/521 |
| 6,239,878 | B1 * | 5/2001 | Goldberg | 356/520 |
| 6,307,635 | B1 * | 10/2001 | Goldberg | 356/521 |
| 6,312,373 | B1 * | 11/2001 | Ichihara | 356/515 |
| 6,456,382 | B2 * | 9/2002 | Ichihara et al. | 356/513 |
| 6,765,683 | B2 * | 7/2004 | Ichihara | 356/521 |
| 7,008,794 | B2 * | 3/2006 | Goh et al. | 436/164 |
| 7,295,326 | B2 * | 11/2007 | Hasegawa | 356/515 |
| 7,295,327 | B2 * | 11/2007 | Ohkubo | 356/515 |
| 7,304,749 | B2 * | 12/2007 | Ohkubo | 356/521 |
| 7,333,216 | B2 * | 2/2008 | Wegmann et al. | 356/521 |
| 7,352,475 | B2 * | 4/2008 | Hasegawa | 356/515 |
| 7,428,059 | B2 * | 9/2008 | Tezuka | 356/521 |
| 7,443,515 | B2 * | 10/2008 | Kato | 356/515 |
| 7,463,365 | B2 * | 12/2008 | Tezuka | 356/515 |
| 2003/0215053 | A1 * | 11/2003 | Ichihara | 378/36 |
| 2005/0117170 | A1 | 6/2005 | Hasegawa | 356/521 |
| 2005/0190378 | A1 * | 9/2005 | Nakauchi | 356/515 |
| 2006/0262323 | A1 * | 11/2006 | Yamamoto | 356/515 |
| 2007/0285671 | A1 * | 12/2007 | Tezuka | 356/515 |
| 2009/0066925 | A1 * | 3/2009 | Ohsaki et al. | 355/53 |

FOREIGN PATENT DOCUMENTS

| | | |
|---|---|---|
| JP | 2000-97666 | 4/2000 |
| JP | 2000-146705 | 5/2000 |
| JP | 2005-159213 | 6/2005 |

OTHER PUBLICATIONS

Daniel Malacara, "Optical Shop Testing," John Wiley & Sons, Inc. 231 (1978).

* cited by examiner

*Primary Examiner*—Patrick J Connolly
*Assistant Examiner*—Scott M Richey
(74) *Attorney, Agent, or Firm*—Fitzpatrick, Cella, Harper & Scinto

(57) ABSTRACT

A measurement apparatus which measures a wavefront aberration of an optical system to be measured, the apparatus comprises a detection unit configured to detect an interference pattern formed by light having passed through a mask inserted on an object plane of the optical system to be measured, and a mask inserted on an image plane of the optical system to be measured.

8 Claims, 26 Drawing Sheets

F I G. 2A
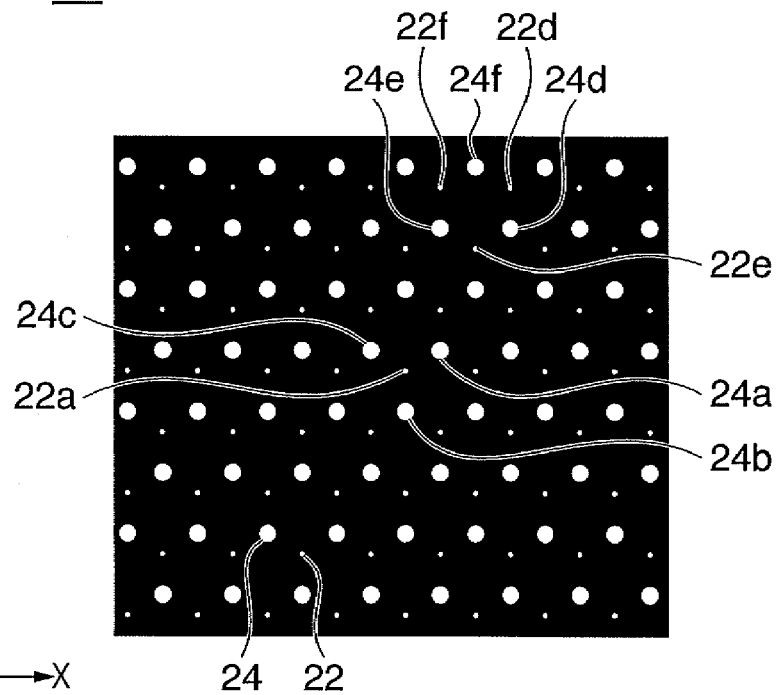
F I G. 2B
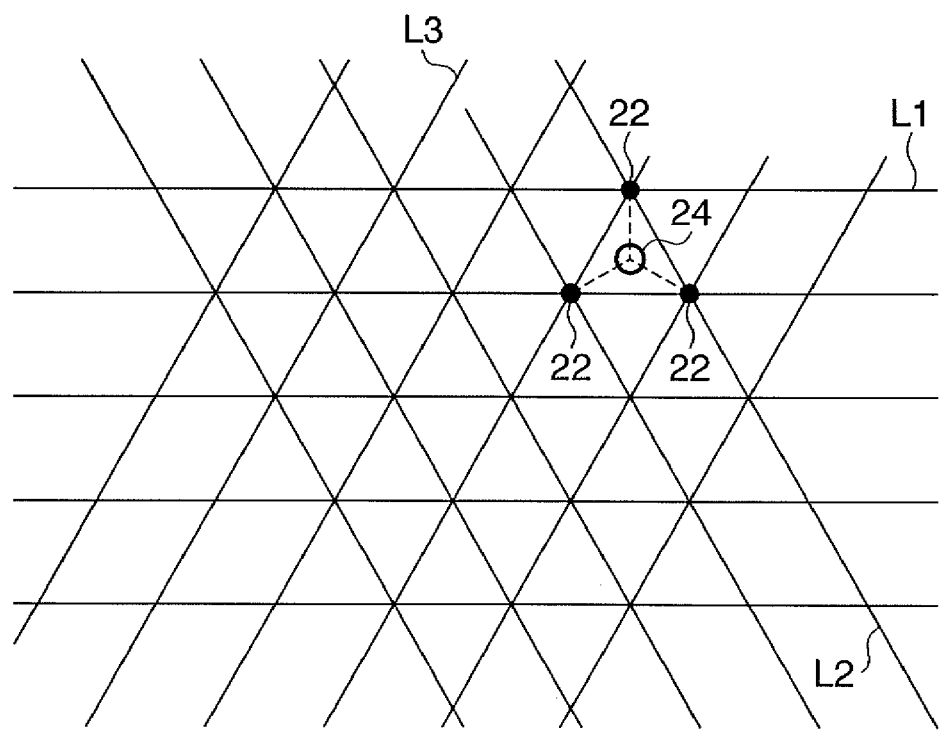

60D

60C

60B

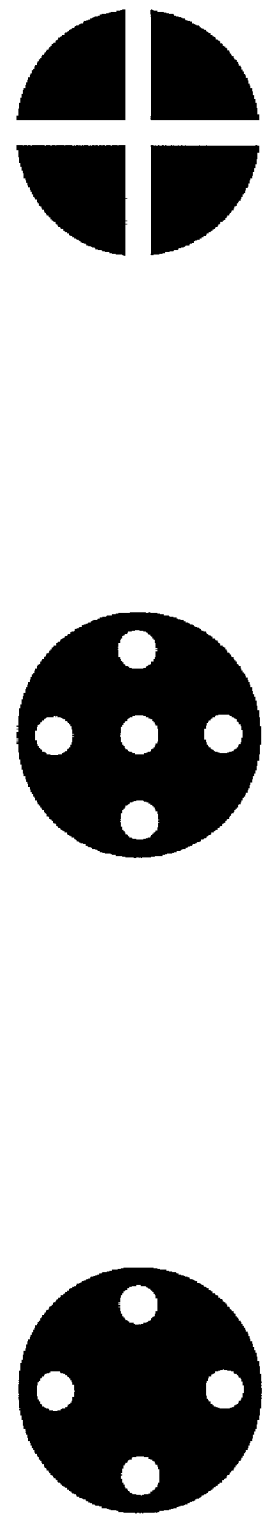

FIG. 19A
60F
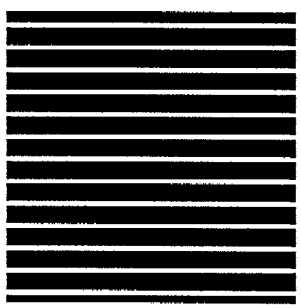
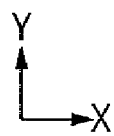
FIG. 19B
60G
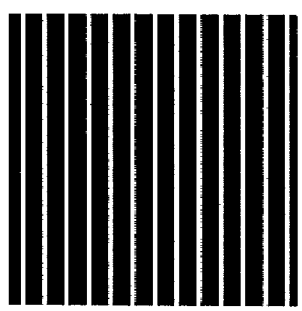

MEASUREMENT APPARATUS, EXPOSURE APPARATUS, AND DEVICE FABRICATION METHOD

BACKGROUND OF THE INVENTION

1. Field of the Invention

The present invention relates to a measurement apparatus, an exposure apparatus, and a device fabrication method.

2. Description of the Related Art

A projection exposure apparatus has conventionally been employed to fabricate microdevices, for example, semiconductor devices such as an IC and LSI, an image sensing device such as a CCD, a display device such as a liquid crystal panel, and a magnetic head by using photolithography. The projection exposure apparatus transfers a pattern formed on a reticle (mask) onto, for example, a wafer via a projection optical system. The exposure apparatus is required to exactly transfer the pattern of the reticle onto the wafer at a predetermined magnification, so it is important to use a projection optical system with a good imaging performance and small aberration.

In recent years, as further micropatterning of semiconductor devices is in progress, patterns to be transferred are becoming sensitive to the aberrations of projection optical systems. This makes it necessary to accurately measure the optical performances (e.g., the wavefront aberration) of a projection optical system while it is built in an exposure apparatus.

A preferable measurement apparatus which measures the wavefront aberration of the projection optical system on the exposure apparatus is the one which attains space saving and uses a light source with low coherence. Under the circumstances, a PDI (Point Diffraction Interferometer) and a shearing interferometer have conventionally been proposed. Techniques associated with these proposals are disclosed in Japanese Patent Laid-Open Nos. 2005-159213, 2000-97666, and 2000-146705, and Daniel Malacara, "Optical Shop Testing", John Wiley & Sons, Inc. 231 (1978).

Unfortunately, the PDI significantly decreases the light quantity of light beams which form an interference pattern, because pinholes must be formed on the object-plane side and image-plane side of an optical system to be measured (projection optical system). Particularly when a light source of an exposure apparatus is used, it is difficult to measure the wavefront aberration.

The shearing interferometer can suppress a decrease in the light quantity of light beams which form an interference pattern as compared with the PDI because pinholes need only be formed on the object-plane side of the optical system to be measured. However, the shearing interferometer outputs a measurement result (measurement value) as the derivative value of the wavefront aberration of the optical system to be measured. The absolute value of the measurement value is so small that the measurement value becomes very sensitive to a measurement error. In addition, since the measurement value must be integrated, the measurement accuracy deteriorates and the processing system is complicated. Since the entire pupil plane of the optical system to be measured cannot be measured at once, the measurement takes a long period of time.

SUMMARY OF THE INVENTION

The present invention provides a measurement apparatus which can accurately measure the optical performances (e.g., the wavefront aberration) of an optical system to be measured, in a short period of time with a simple arrangement.

According to one aspect of the present invention, there is provided a measurement apparatus which measures a wavefront aberration of an optical system to be measured, the apparatus comprising a detection unit configured to detect an interference pattern formed by light having passed through a mask inserted on an object plane of the optical system to be measured, and a mask inserted on an image plane of the optical system to be measured, wherein a plurality of first pinholes each of which has a first diameter and which are spaced apart from each other by a distance at which the plurality of first pinholes do not have coherence, and a plurality of second pinholes each of which has a second diameter larger than the first diameter and is spaced apart from a corresponding one of the plurality of first pinholes by a distance at which the each first pinhole and the corresponding second pinhole have coherence are formed in the mask inserted on the object plane of the optical system to be measured, and a plurality of third pinholes each of which has a third diameter and which are formed to receive light beams having passed through the plurality of first pinholes and the optical system to be measured, and a plurality of fourth pinholes each of which has a fourth diameter smaller than the third diameter and which are formed to receive light beams having passed through the plurality of second pinholes and the optical system to be measured are formed in the mask inserted on the image plane of the optical system to be measured.

According to another aspect of the present invention, there is provided an exposure apparatus comprising an illumination optical system configured to illuminate a reticle with a light beam from a light source, a projection optical system configured to project a pattern of the reticle onto a substrate, and a measurement apparatus configured to measure a wavefront aberration of the projection optical system as an optical system to be measured, wherein the measurement apparatus includes the above measurement apparatus.

According to still another aspect of the present invention, there is provided a device fabrication method comprising steps of exposing a substrate using the above exposure apparatus, and performing a development process for the substrate exposed.

Further features of the present invention will become apparent from the following description of exemplary embodiments with reference to the attached drawings.

BRIEF DESCRIPTION OF THE DRAWINGS

FIG. 2A is a schematic plan view of a first mask of the measurement apparatus shown in FIG. 1.

FIG. 2B is a view for explaining the arrangement of small pinholes and large pinholes of the first mask of the measurement apparatus shown in FIG. 1.

FIGS. 15A to 15C are schematic plan views showing examples of an effective light source distribution formed by an illumination optical system of the measurement apparatus shown in FIG. 12.

FIGS. 19A and 19B are schematic plan views showing diffraction gratings as another example of the optical division unit applicable to the measurement apparatus shown in FIG. 12.

DESCRIPTION OF THE EMBODIMENTS

Figure 1:
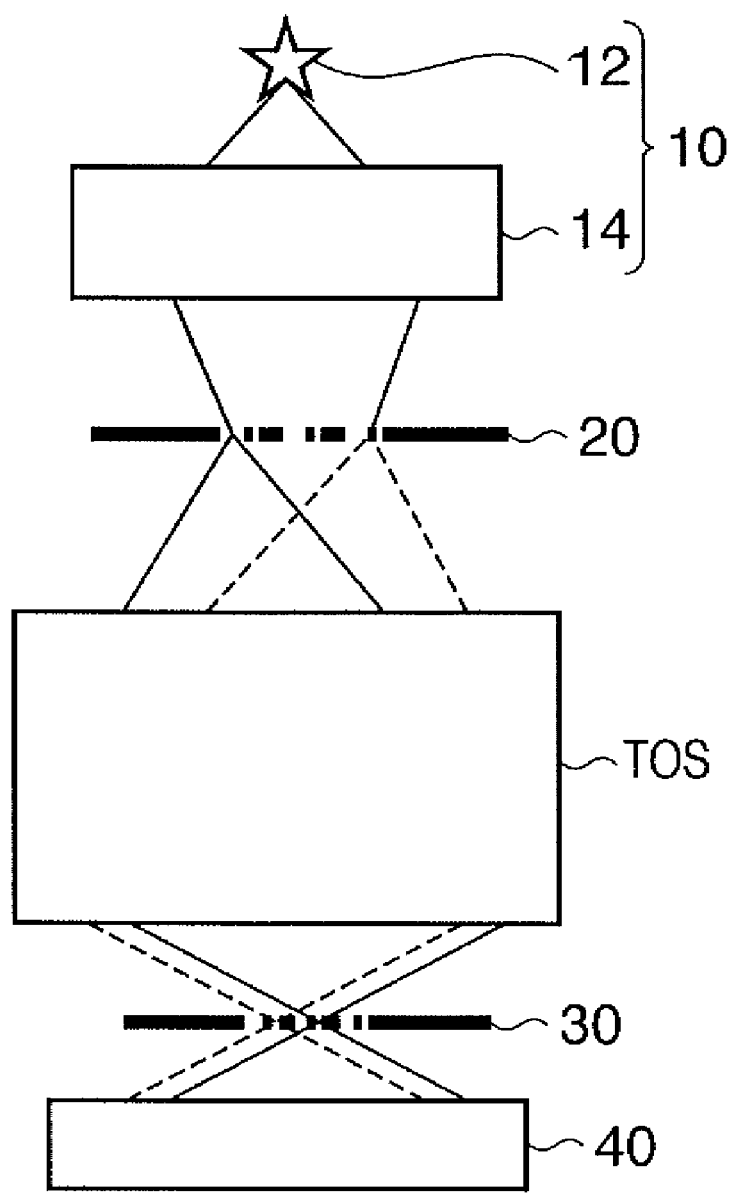
FIG. 1 is a schematic sectional view of a measurement apparatus according to one aspect of the present invention.

Preferred embodiments of the present invention will be described below with reference to the accompanying drawings. The same reference numerals denote the same members throughout the drawings, and a repetitive description thereof will be omitted.

First Embodiment

FIG. 1 is a schematic sectional view showing a measurement apparatus 1 according to the first embodiment of the present invention. The measurement apparatus 1 measures the optical performances of an optical system TOS to be measured. In this embodiment, the optical system TOS to be measured is a projection optical system used for an exposure apparatus, and the measurement apparatus 1 measures the wavefront aberration of the projection optical system. As shown in FIG. 1, the measurement apparatus 1 includes an illumination apparatus 10, first mask 20, second mask 30, and detection unit 40.

The illumination apparatus 10 illuminates the first mask 20, and includes a light source unit 12 and illumination optical system 14.

The light source unit 12 uses a light source similar to that of an exposure apparatus using a projection optical system as the optical system TOS to be measured. The light source unit 12 uses, for example, an ArF excimer laser having a wavelength of about 193 nm or a KrF excimer laser having a wavelength of about 248 nm as the light source.

The illumination optical system 14 Koehler-illuminates the first mask 20. The illumination optical system 14 includes, for example, a fly-eye lens, aperture stop, condenser lens, and slit, and has a function of forming an effective light source with a desired shape, as will be described later.

The first mask 20 is an object side mask inserted on the object plane of the optical system TOS to be measured. As shown in FIG. 2A, the first mask 20 has a plurality of small pinholes 22 each having a first diameter, and large pinholes 24 each of which has a second diameter larger than the first diameter and is spaced apart from a corresponding one of the plurality of small pinholes 22 by a distance at which they have coherence. In the following description, all small pinholes (e.g., small pinholes 22a and 22d to 22f) formed in the first mask 20 will be generically referred to as the small pinholes 22. Similarly, all large pinholes (e.g., large pinholes 24a to 24f) formed in the first mask 20 will be generically referred to as the large pinholes 24. FIG. 2A is a schematic plan view showing the first mask 20.

Figure 3:
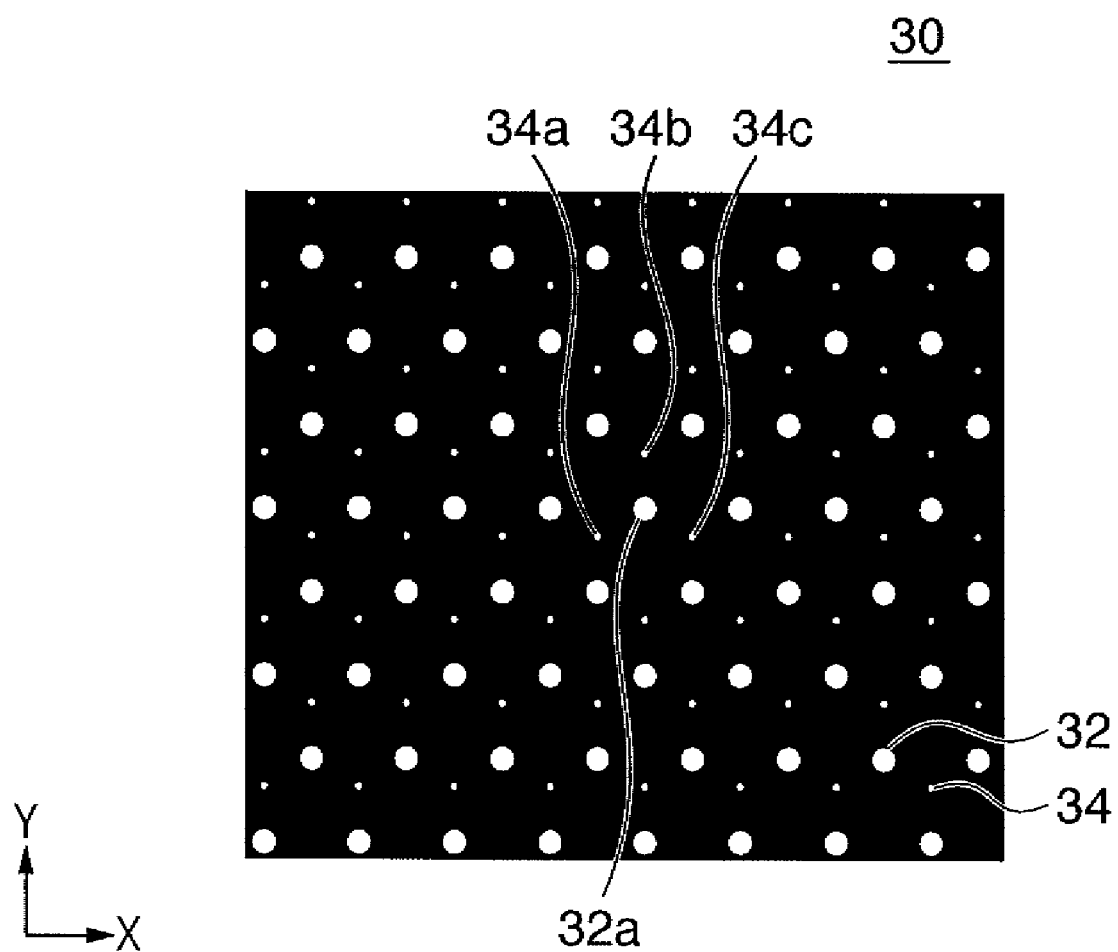
FIG. 3 is a schematic plan view of a second mask of the measurement apparatus shown in FIG. 1.

The second mask 30 is an image side mask inserted on the image plane of the optical system TOS to be measured. As shown in FIG. 3, the second mask 30 has a plurality of large pinholes 32 each of which has a third diameter and which are formed in correspondence with the plurality of small pinholes 22 of the first mask 20. More specifically, the large pinholes 32 are formed to receive light beams having passed through the small pinholes 22 of the first mask 20 and the optical system TOS to be measured. The second mask 30 has a plurality of small pinholes 34 each of which has a fourth diameter smaller than the third diameter and which are formed in correspondence with the plurality of large pinholes 24 of the first mask 20. More specifically, the small pinholes 34 are formed to receive light beams having passed through the large pinholes 24 of the first mask 20 and the optical system TOS to be measured. The large pinholes 32 and small pinholes 34 of the second mask 30 fall within a region in which the aberration of the optical system TOS to be measured is nearly the same. In the following description, all large pinholes (e.g., a large pinhole 32a) formed in the second mask 30 will be generically referred to as the large pinholes 32. Similarly, all small pinholes (e.g., small pinholes 34a to 34c)

formed in the second mask 30 will be referred to as a plurality of small pinholes 34. FIG. 3 is a schematic plan view showing the second mask 30.

The detection unit 40 is an optical image sensing device which includes a photoelectric conversion device (optical sensor) such as a CCD camera. The detection unit 40 detects an interference pattern formed by a light beam from one of the plurality of large pinholes 32 of the second mask 30 and light beams from at least two of the plurality of small pinholes 34. More specifically, the detection unit 40 detects a plurality of interference patterns each of which is formed by four light beams, that is, a light beam from the large pinhole 32a and light beams from the small pinholes 34a to 34c.

The illumination apparatus 10 (illumination optical system 14), first mask 20, and second mask 30 will be explained in detail below.

The illumination apparatus 10 will be explained first. In the exposure apparatus, if the spatial coherence between light beams which illuminate a reticle is relatively high, the light beams having passed through a pattern formed on the reticle interfere with each other. This makes it impossible to transfer the pattern onto a wafer (substrate). For this reason, the spatial coherence between light beams which illuminate the reticle is decreased using, for example, a fly-eye lens. Since the measurement apparatus 1 serves to measure the wavefront aberration of the projection optical system as the optical system TOS to be measured on the exposure apparatus (i.e., while being mounted on the exposure apparatus), it uses an illumination apparatus of the exposure apparatus as the illumination apparatus 10. In other words, the illumination apparatus 10 illuminates the first mask 20 with light beams after decreasing the spatial coherence that is disadvantageous to an interferometer.

For this purpose, the illumination apparatus 10 adjusts the effective light source distribution using the illumination optical system 14 to control the coherence length and coherence direction of light beams having passed through the first mask 20 (small pinholes 22 and large pinholes 24) such that only desired light beams interfere with each other. In other words, the illumination optical system 14 forms an effective light source distribution in which only a light beam from each small pinhole 22 of the first mask 20 and light beams from large pinholes 24 adjacent to it have coherence. For example, as shown in FIGS. 4A to 4E, the illumination optical system 14 forms an effective light source distribution in which a light beam having passed through the small pinhole 22a and light beams from the large pinholes 24a to 24c spaced apart from the small pinhole 22a in three directions by the same distance have coherence. FIGS. 4A to 4E are schematic plan views showing examples of the effective light source distribution formed by the illumination optical system 14.

A quantitative value (so-called the mutual intensity) indicating the coherence is obtained by Fourier-transforming the effective light source distribution in accordance with the Van Cittert-Zernike theorem. The illumination optical system 14 can form an effective light source distribution (e.g., the effective light source distributions shown in FIGS. 4A to 4E) corresponding to a desired mutual intensity. For example, the mutual intensity as shown in FIG. 5 can be obtained from the effective light source distribution shown in FIG. 4A to increase the coherence between only light beams from each small pinhole 22 and large pinholes 24 adjacent to it. As described above, the mutual intensity shown in FIG. 5, for example, is obtained throughout the entire illumination region on the first mask 20 so that the illumination optical system 14 Koehler-illuminates the first mask 20. FIG. 5 is a view showing the mutual intensity obtained from the effective light source distribution shown in FIG. 4A.

The first mask 20 and second mask 30 will be explained next. Let NAob be the object side numerical aperture of the optical system TOS to be measured, and $\lambda$ be the wavelength of a light beam from the light source unit 12. Then, a first diameter Rob of the small pinhole 22 of the first mask 20 satisfies relation (1).

$$Rob \leq 0.61 \times \lambda / NAob \tag{1}$$

In other words, the first diameter Rob of the small pinhole 22 is equal to or smaller than the diffraction limit of the illumination optical system 14. Therefore, a light beam (transmitted light beam) having passed through the small pinhole 22 turns into an ideal spherical wave.

Let NAim be the image side numerical aperture of the optical system TOS to be measured, and $\lambda$ be the wavelength of a light beam from the light source unit 12. Then, a fourth diameter Rim of the small pinhole 34 of the second mask 30 satisfies relation (2).

$$Rim \leq 0.61 \times \lambda / NAim \tag{2}$$

In other words, the fourth diameter Rim of the small pinhole 34 is equal to or smaller than the diffraction limit of the optical system TOS to be measured. Therefore, a light beam (transmitted light beam) having passed through the small pinhole 34 turns into an ideal spherical wave.

A distance da between the large pinhole 32 and small pinhole 34 of the second mask 30 satisfies inequality (3).

$$da > \text{(the divergence, on the image plane, of a light beam having passed through the large pinhole 24 of the first mask 20)} + \text{(the radius of the large pinhole 32 of the second mask 30)} \tag{3}$$

where "the divergence, on the image plane, of a light beam having passed through the large pinhole 24 of the first mask 20" is the divergence of the intensity distribution on the image plane due to the aberration and diffraction of the optical system TOS to be measured.

In other words, the second diameter of the large pinhole 24 of the first mask 20 and the third diameter of the large pinhole 32 of the second mask 30 are determined such that a light beam having passed through the large pinhole 24 does not enter the large pinhole 32. Furthermore, the third diameter of the large pinhole 32 of the second mask 30 is large enough to maintain information on the wavefront aberration of the optical system TOS to be measured.

Figure 6:
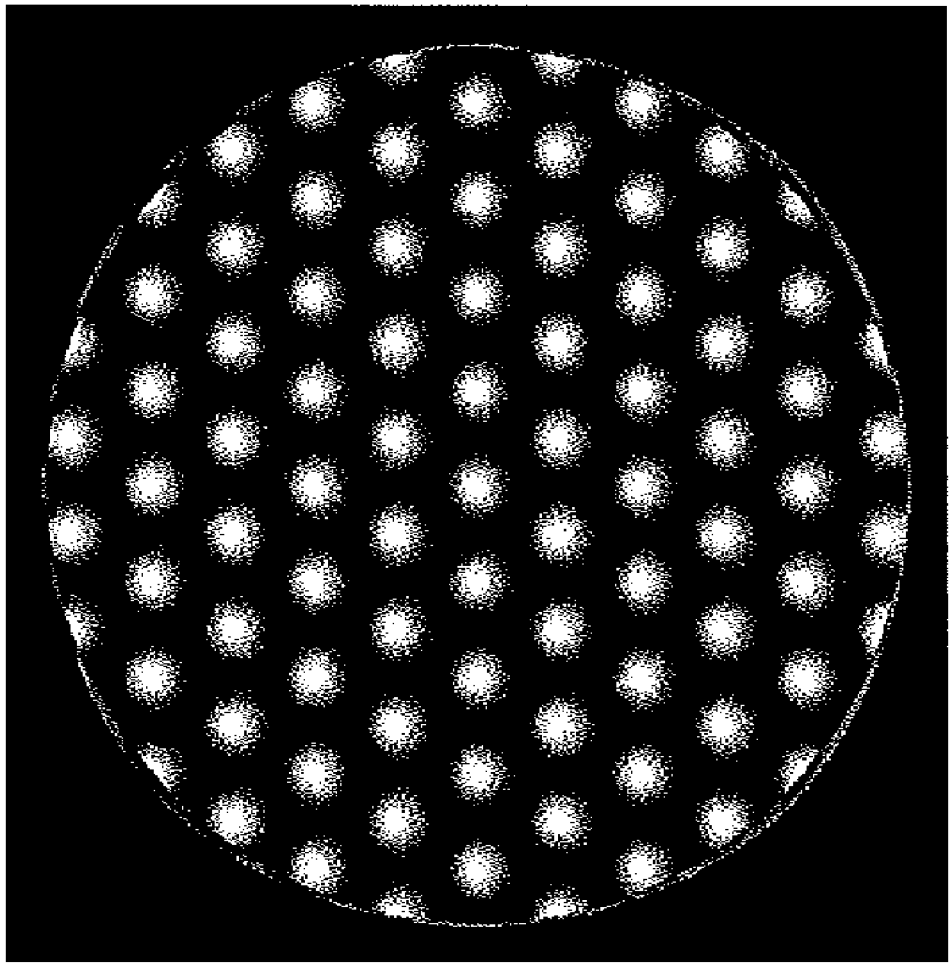
FIG. 6 is a view showing an example of an interference pattern formed by light beams having passed through the first mask and a second mask of the measurement apparatus shown in FIG. 1.
Figure 7C:
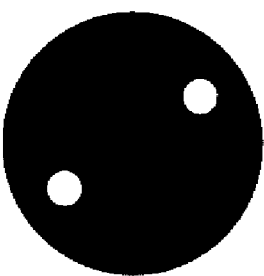
FIGS. 7A to 7C are schematic plan views showing other examples of the effective light source distribution formed by the illumination optical system of the measurement apparatus shown in FIG. 1.
Figure 7B:
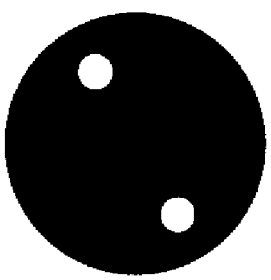
Figure 7A:
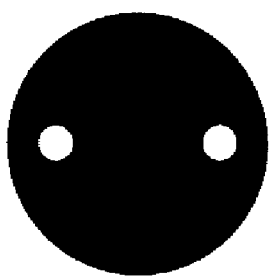
Figure 8A:
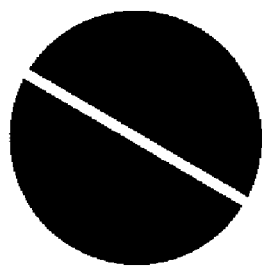
FIGS. 8A to 8C are schematic plan views showing still other examples of the effective light source distribution formed by the illumination optical system of the measurement apparatus shown in FIG. 1.
Figure 8B:
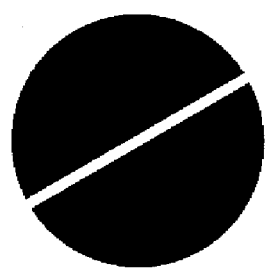
Figure 8C:
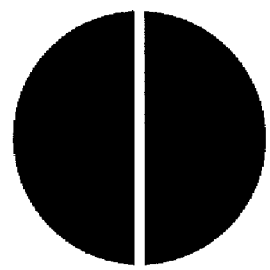

The optical system TOS to be measured projects an image of the small pinhole 22a of the first mask 20 onto the large pinhole 32a of the second mask 30, while it projects images of the large pinholes 24a to 24c of the first mask 20 onto the small pinholes 34a to 34c of the second mask 30. A light beam having passed through the small pinhole 22a of the first mask 20 and the large pinhole 32a of the second mask 30 has only information on the wavefront aberration of the optical system TOS to be measured. Light beams having passed through the large pinholes 24a to 24c of the first mask 20 and the small pinholes 34a to 34c of the second mask 30 turn into ideal spherical waves. When these four light beams interfere with each other on the detection unit 40, it is possible to obtain an interference pattern having six-fold symmetry as shown in FIG. 6. Referring to FIG. 6, an interference pattern with high contrast is obtained by a light beam having passed through the small pinhole 22a and light beams having passed through the large pinholes 24a to 24c of the first mask 20, because they have high coherence. In this manner, light beams having passed through each small pinhole 22 and large pinholes 24 adjacent to it interfere with each other. Light beams having passed through the large pinholes 24a to 24c, for example, have low coherence and do not interfere with each other. Therefore, interference between the light beams having passed through the large pinholes 24a to 24c of the first mask 20 has no influence on the measurement accuracy. FIG. 6 is a view showing an example of an interference pattern formed by light beams having passed through the first mask 20 and second mask 30.

As shown in FIG. 2A, the small pinholes 22 and large pinholes 24 are periodically, two-dimensionally formed in the first mask 20. More specifically, three small pinholes 22 (e.g., small pinholes 22d to 22f) and three large pinholes 24 (e.g., large pinholes 24d to 24f) are alternately formed at the vertices of a honeycombed equilateral hexagon. That is, three small pinholes 22 form an equilateral triangle. Large pinholes 24 are formed at the positions of the centers of gravity of equilateral triangles oriented in the same direction (in the upward direction of FIG. 2A) by alternately inserting equilateral triangles oriented in the opposite direction, of the obtained equilateral triangles. For example, as shown in FIG. 2B, assume a virtual space defined by a plurality of first virtual lines L1, a plurality of second virtual lines L2, and a plurality of third virtual lines L3. The plurality of first virtual lines L1 run parallel to a first direction at a first interval. The plurality of second virtual lines L2 run parallel to a second direction, which forms an angle of 60° with the first direction, at the first interval. The plurality of third virtual lines L3 run in a third direction, which forms an angle of 60° with the first direction and is different from the second direction, at the first interval. In the virtual space shown in FIG. 2B, the small pinholes 22 are formed at the intersections among the first virtual lines L1, the second virtual lines L2, and the third virtual lines L3. The large pinholes 24 are formed at the positions of the centers of gravity of equilateral triangles oriented in the same direction (in the upward direction of FIG. 2B) by alternately inserting equilateral triangles oriented in the opposite direction, of equilateral triangles formed by the intersections among the first virtual lines L1, the second virtual lines L2, and the third virtual lines L3. This makes it possible to densely form the small pinholes 22 and large pinholes 24, thus increasing the light quantity. On the other hand, the large pinholes 32 and small pinholes 34 of the first mask 20 are formed in correspondence with the small pinholes 22 and large pinholes 24 of the first mask 20. FIG. 2B is a view for explaining the arrangement of the small pinholes 22 and large pinholes 24 of the first mask 20.

On the detection unit 40, four light beams form an interference pattern in which they are superposed on each other while being shifted in three directions by integer multiples of a distance $\sqrt{3}da$. The distance da between the large pinhole 32 and small pinhole 34 of the second mask 30 is sufficiently short, so the pinholes are densely formed. This makes it possible to increase the light quantity without deteriorating the measurement accuracy. Even though increasing the number of pinholes makes it possible to further increase the light quantity, the interference patterns are shifted and add up. As the pinhole formation range (area) widens, therefore, the contrast decreases. Hence, the range in which the pinholes (large pinholes 32 and small pinholes 34) of the second mask 30 are formed preferably falls within 1/10 the interference pattern pitch.

To acquire the phase information of the wavefront aberration of the optical system TOS to be measured from an interference pattern obtained by the detection unit 40, an electronic moiré method or FFT method is used. The use of these methods allows acquiring the phase information of the wavefront aberration of the optical system TOS to be measured from one interference pattern so as to measure the wavefront aberration of the optical system TOS to be measured in a short period of time. For example, if the electronic moiré method is used, three types of electronic gratings in which slits run in directions shifted from each other by 120° are applied to the interference pattern. If the FFT method is used, peaks having six-fold symmetry appear on the Fourier space upon two-dimensionally Fourier-transforming the interference pattern. Information on the vicinities of three peaks for every 120° of these peaks is used. With this operation, three wavefront aberrations are obtained. If no measurement error is generated at all, the three wavefront aberrations are equal to each other. In practice, however, the three wavefront aberrations are often different from each other due to a measurement error. The measurement error is preferably reduced by, for example, averaging the three wavefront aberrations.

It is also possible to improve the measurement accuracy of the measurement apparatus 1 by forming three effective light source distributions as shown in FIGS. 7A to 7C or 8A to 8C using the illumination optical system 14, and illuminating the first mask 20 with these three effective light source distributions. More specifically, the coherence between a light beam having passed through the small pinhole 22a (large pinhole 32a) and a light beam having passed through the large pinhole 24b (small pinhole 34b) is increased using the effective light source distribution shown in FIG. 7A or 8A, thereby detecting their interference pattern. The coherence between the light beam having passed through the small pinhole 22a (large pinhole 32a) and a light beam having passed through the large pinhole 24a (small pinhole 34a) is increased using the effective light source distribution shown in FIG. 7B or 8B, thereby detecting their interference pattern. The coherence between the light beam having passed through the small pinhole 22a (large pinhole 32a) and a light beam having passed through the large pinhole 24c (small pinhole 34c) is increased using the effective light source distribution shown in FIG. 7C or 8C, thereby detecting their interference pattern. Although the illumination optical system 14 forms the three effective light source distributions shown in FIGS. 7A to 7C or 8A to 8C in this embodiment, the optical system TOS to be measured may be rotated after forming one effective light source distribution shown in FIG. 7A or 8A. FIGS. 7A to 7C and 8A to 8C are schematic plan views showing examples of the effective light source distribution formed by the illumination optical system 14.

As described above, the measurement apparatus 1 according to the first embodiment can accurately measure the optical performances (e.g., the wavefront aberration) of the optical system to be measured, in a short period of time with a simple arrangement.

Second Embodiment

Figure 9:
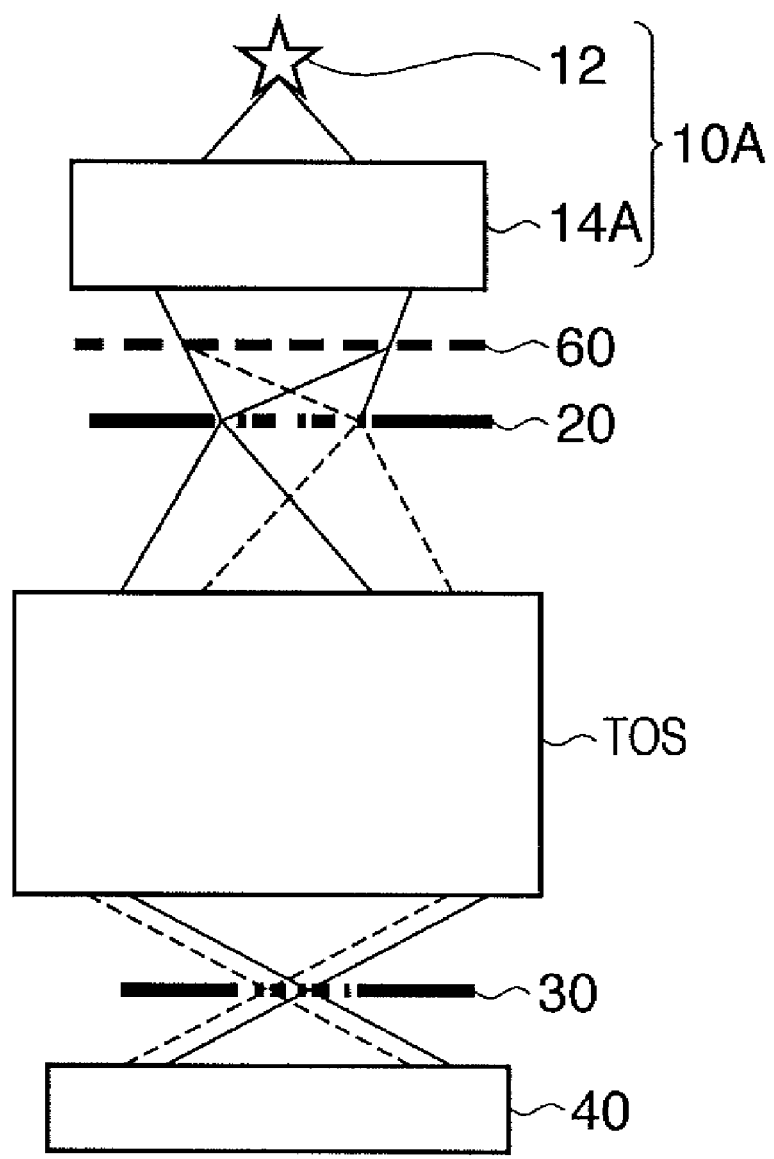
FIG. 9 is a schematic sectional view of a measurement apparatus according to one aspect of the present invention.

FIG. 9 is a schematic sectional view showing a measurement apparatus 1A according to the second embodiment of the present invention. The measurement apparatus 1A measures the optical performances of an optical system TOS to be measured. In this embodiment, the optical system TOS to be measured is a projection optical system used for an exposure apparatus, and the measurement apparatus 1A measures the wavefront aberration of the projection optical system. As shown in FIG. 9, the measurement apparatus 1A includes an illumination apparatus 10A, first mask 20, second mask 30, detection unit 40, and optical division unit 60. The measurement apparatus 1A controls the coherence using the optical division unit 60 in place of the effective light source distribution, unlike the measurement apparatus 1 according to the first embodiment.

The illumination apparatus 10A illuminates the first mask 20, and includes a light source unit 12 and illumination optical system 14A. The illumination optical system 14A is different from the illumination optical system 14 only in that it has no function of forming a desired effective light source distribution, and a detailed description thereof will not be repeated.

Figure 10:
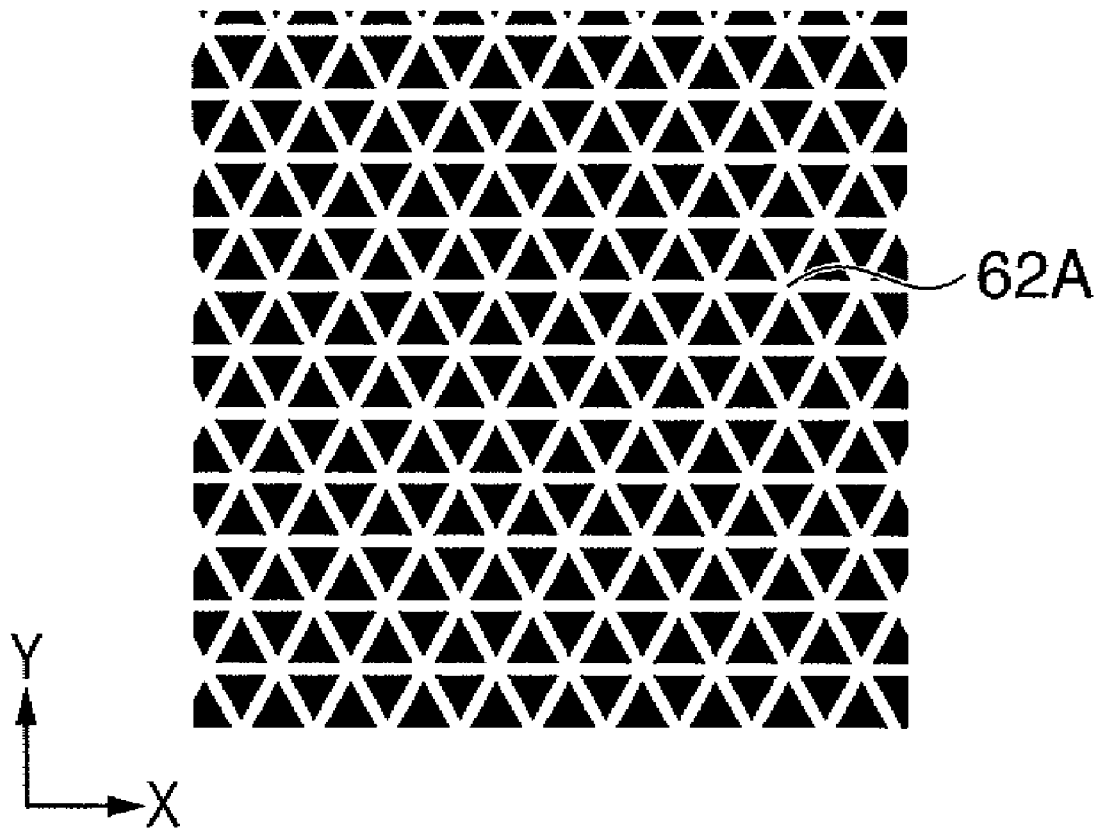
FIG. 10 is a schematic plan view showing a diffraction grating as an example of an optical division unit of the measurement apparatus shown in FIG. 9.

The optical division unit 60 is inserted on the incident side of the first mask 20 and, more specifically, inserted between the illumination optical system 14A and the first mask 20. The optical division unit 60 splits a light beam which illuminates the first mask 20. As shown in FIG. 10, the optical division unit 60 is formed by a diffraction grating 60A having a transmitting portion 62A which is two-dimensionally arranged such that only a light beam from each small pinhole 22 and light beams from large pinholes 24 adjacent to it in the first mask 20 have coherence. The optical division unit 60 is not particularly limited to the diffraction grating 60A, and may use, for example, a CGH (Computer Generated Hologram). FIG. 10 is a schematic plan view showing the diffraction grating 60A as an example of the optical division unit 60.

Let Pg be the pitch (diffraction grating pitch) of the transmitting portion 62A of the diffraction grating 60A, and Lg be the distance between the diffraction grating 60A and the first mask 20. Then, the diffraction grating pitch Pg and distance Lg satisfy equation (4).

$$Pg=(m*\lambda*Lg)/(n*d) \qquad (4)$$

where d is the distance between the pinholes of the first mask 20, λ is the wavelength of a light beam from the light source unit 12, and n and m are constants (1, 2, 3, ... )

Figure 4A:
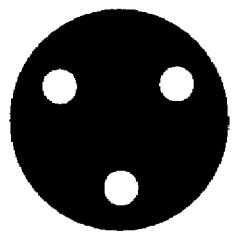
FIGS. 4A to 4E are schematic plan views showing examples of an effective light source distribution formed by an illumination optical system of the measurement apparatus shown in FIG. 1.
Figure 4B:
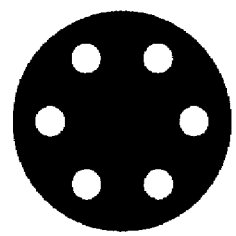
Figure 4C:
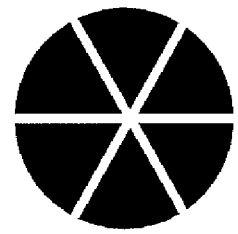
Figure 4D:
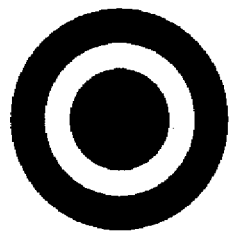
Figure 4E:
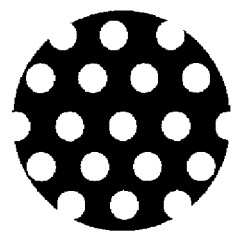
Figure 5:
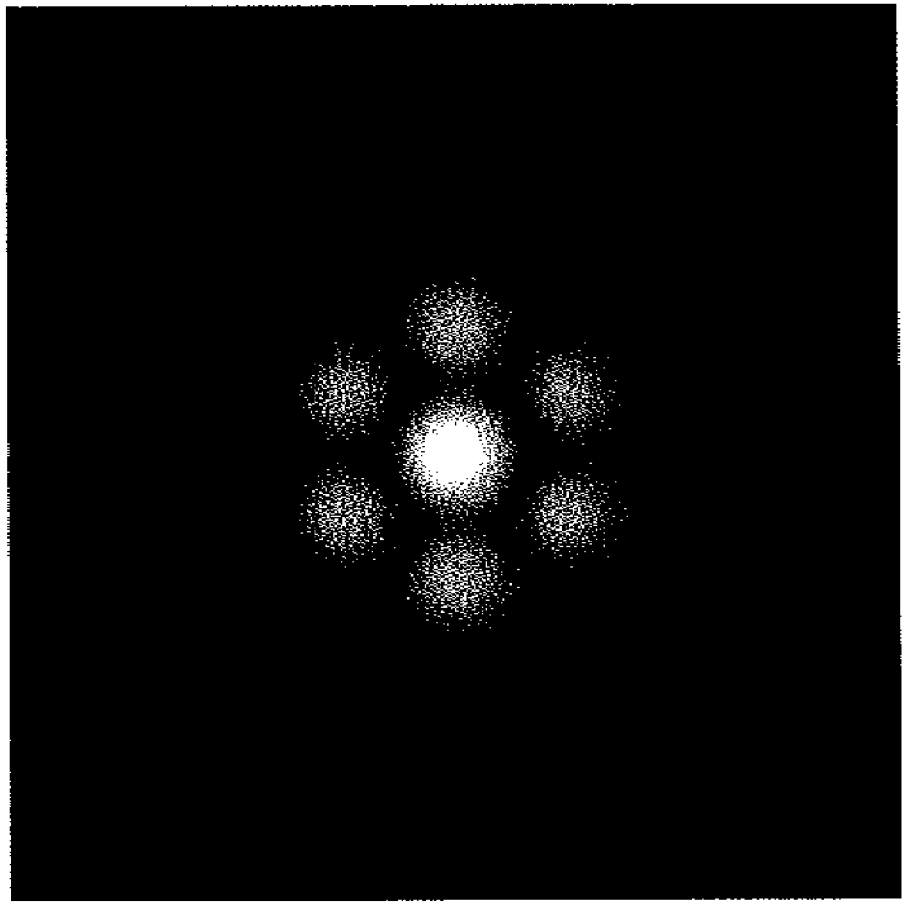
FIG. 5 is a view showing the mutual intensity obtained by the effective light source distribution shown in FIG. 4A.

The mutual intensity indicating coherence attributed to the diffraction grating 60A becomes equivalent to a value obtained by Fourier-transforming the effective light source distribution shown in FIG. 4C.

The diffraction grating 60A diffracts ±1st-order light components having the same coherence, in directions symmetrical about a 0th-order light component. However, the first mask 20 shields one of the +1st-order light component and −1st-order light component from the diffraction grating 60A, so no measurement error is generated. The first mask 20 (small pinholes 22 and large pinholes 24) may be illuminated only with the list-order light components by attaching, for example, a phase shift mask to the diffraction grating 60A without using the 0th-order light component, thereby improving the contrast.

Figure 11C:
FIGS. 11A to 11C are schematic plan views showing diffraction gratings as another example of the optical division unit of the measurement apparatus shown in FIG. 9.
Figure 11B:
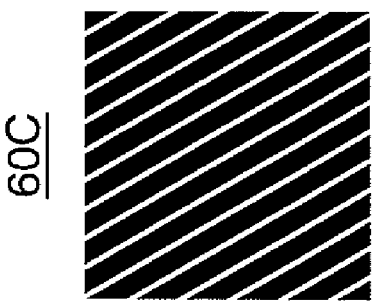
Figure 11A:
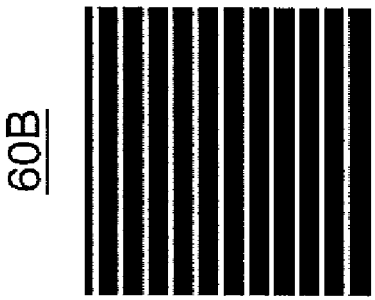

When three diffraction gratings 60B to 60D shown in FIGS. 11A to 11C are interchangeably used (i.e., the diffraction gratings 60B to 60D are interchangeably arranged) as the optical division unit 60, it is possible to improve the measurement accuracy of the measurement apparatus 1A. More specifically, the coherence between a light beam having passed through a small pinhole 22a (large pinhole 32a) and a light beam having passed through a large pinhole 24b (small pinhole 34b) is increased using the diffraction grating 60B, thereby detecting their interference pattern. The coherence between the light beam having passed through the small pinhole 22a (large pinhole 32a) and a light beam having passed through a large pinhole 24a (small pinhole 34a) is increased using the diffraction grating 60C, thereby detecting their interference pattern. The coherence between the light beam having passed through the small pinhole 22a (large pinhole 32a) and a light beam having passed through a large pinhole 24c (small pinhole 34c) is increased using the diffraction grating 60D, thereby detecting their interference pattern. Although the three diffraction gratings 60B to 60D are used as the optical division unit 60 in this embodiment, for example, one diffraction grating 60B may be rotated. FIGS. 11A to 11C are schematic plan views showing the diffraction gratings 60B to 60D as an example of the optical division unit 60.

As described above, the measurement apparatus 1A according to the second embodiment can accurately measure the optical performances (e.g., the wavefront aberration) of the optical system to be measured, in a short period of time with a simple arrangement.

Third Embodiment

Figure 12:
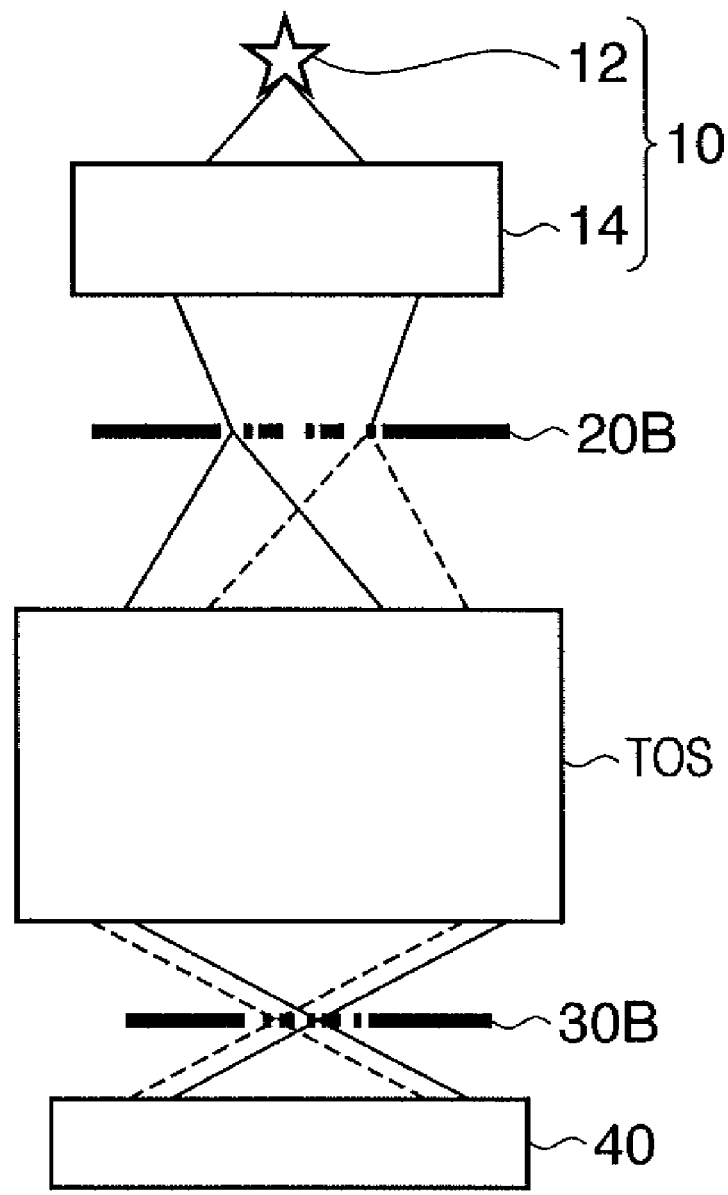
FIG. 12 is a schematic sectional view of a measurement apparatus according to one aspect of the present invention.

FIG. 12 is a schematic sectional view showing a measurement apparatus 1B according to the third embodiment of the present invention. The measurement apparatus 1B measures the optical performances of an optical system TOS to be measured. In this embodiment, the optical system TOS to be measured is a projection optical system used for an exposure apparatus, and the measurement apparatus 1B measures the wavefront aberration of the projection optical system. As shown in FIG. 12, the measurement apparatus 1B includes an illumination apparatus 10, first mask 20B, second mask 30B, and detection unit 40. The measurement apparatus 1B is different from the measurement apparatus 1 according to the first embodiment in that it has the first mask 20B and second mask 30B.

Figure 13:
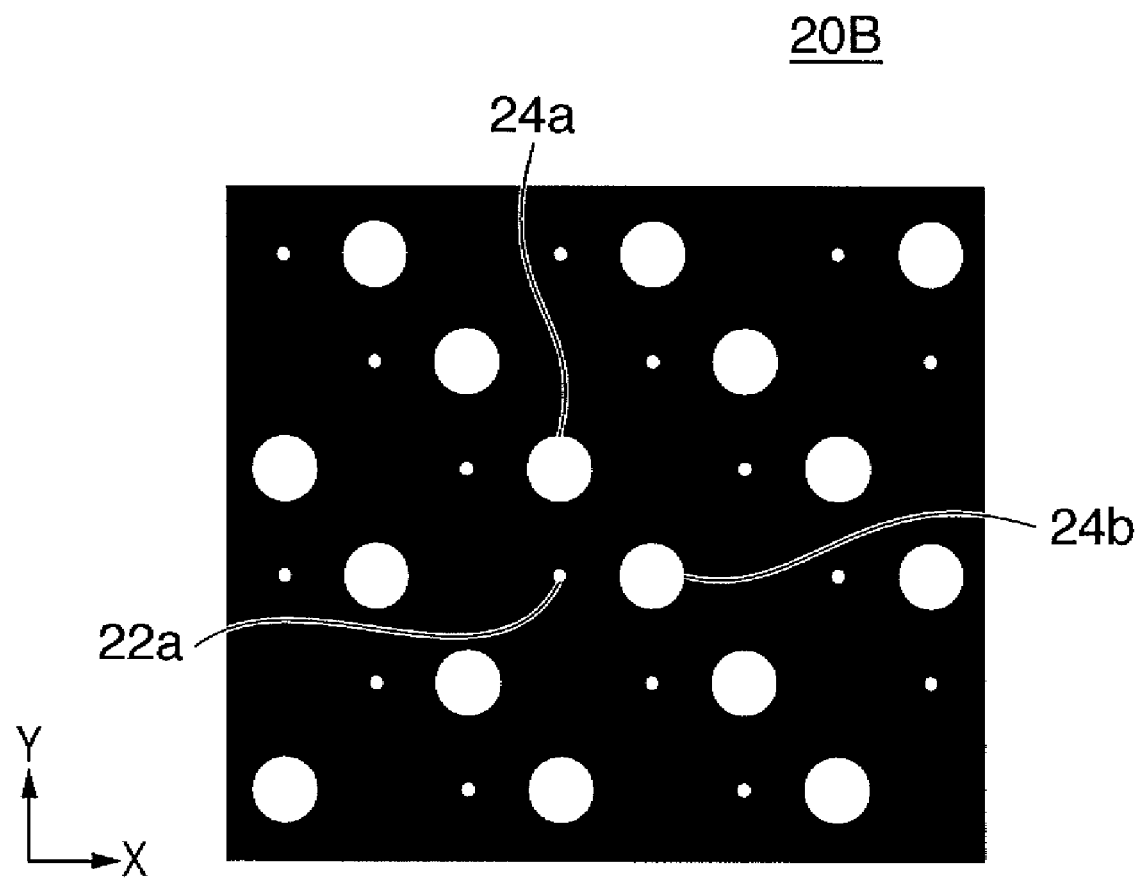
FIG. 13 is a schematic plan view of a first mask of the measurement apparatus shown in FIG. 12.
Figure 14:
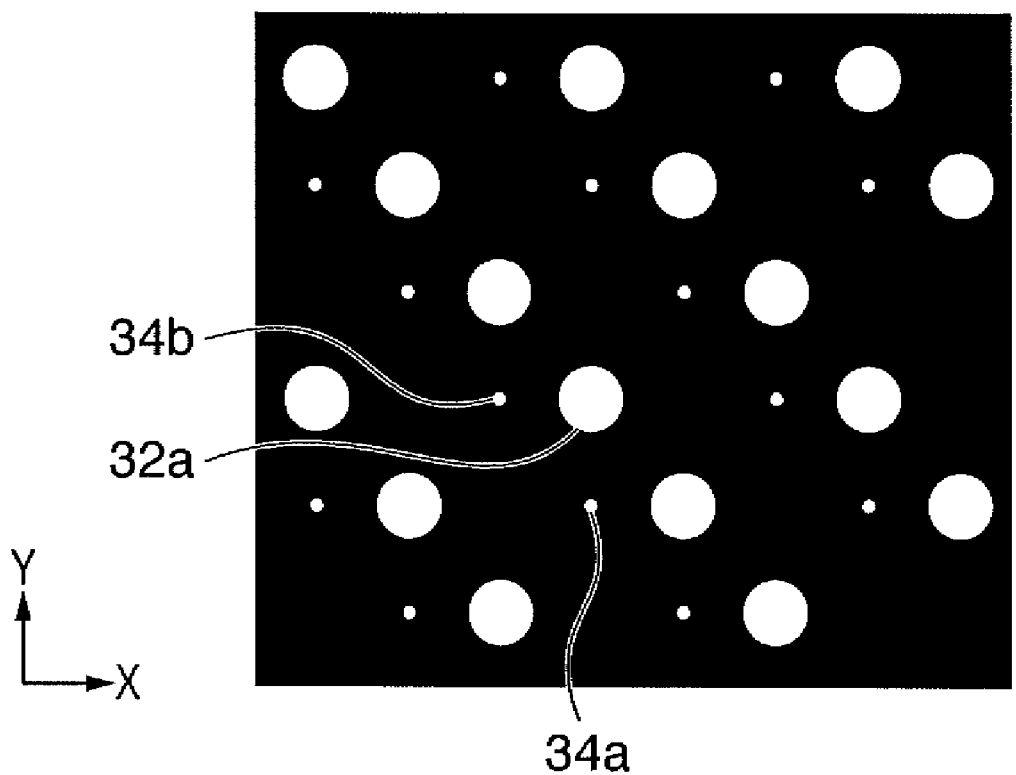
FIG. 14 is a schematic plan view of a second mask of the measurement apparatus shown in FIG. 12.
Figure 16A:
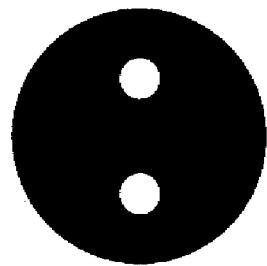
FIGS. 16A and 16B are schematic plan views showing other examples of the effective light source distribution formed by the illumination optical system of the measurement apparatus shown in FIG. 12.
Figure 16B:
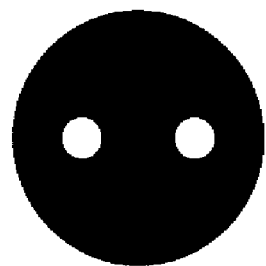
Figure 17A:
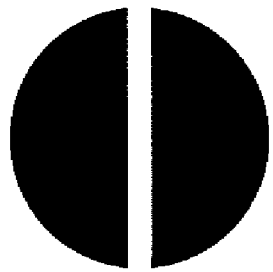
FIGS. 17A and 17B are schematic plan views showing still other examples of the effective light source distribution formed by the illumination optical system of the measurement apparatus shown in FIG. 12.
Figure 17B:
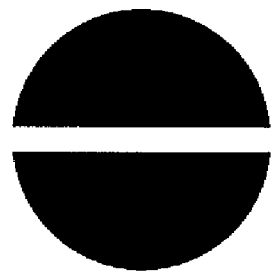

As shown in FIG. 13, the first mask 20B has a plurality of small pinholes 22 and a plurality of large pinholes 24 in the X and Y directions. On the other hand, as shown in FIG. 14, the second mask 30B has a plurality of large pinholes 32 and a plurality of small pinholes 34 formed in correspondence with the plurality of small pinholes 22 and the plurality of large pinholes 24 of the first mask 20B. FIG. 13 is a schematic plan view showing the first mask 20B. FIG. 14 is a schematic plan view showing the second mask 30B.

The illumination apparatus 10 (an illumination optical system 14), the first mask 20B, and the second mask 30B will be explained in detail below.

The illumination apparatus 10 will be explained first. The illumination apparatus 10 adjusts the effective light source distribution using the illumination optical system 14 to control the coherence length and coherence direction of light beams having passed through the first mask 20B (small pinholes 22 and large pinholes 24) such that only desired light beams interfere with each other. For example, as shown in FIGS. 15A to 15C, the illumination optical system 14 forms effective light source distributions in each of which only a light beam having passed through a small pinhole 22a and light beams having passed through large pinholes 24a and 24b have coherence. In other words, the illumination optical system 14 illuminates a desired position on the first mask 20B in the X and Y directions with light beams having high coherence. FIGS. 15A to 15C are schematic plan views showing examples of the effective light source distribution formed by the illumination optical system 14.

The first mask 20B and second mask 30B will be explained next. As described above, a first diameter Rob of the small pinhole 22 of the first mask 20B satisfies relation (1). Therefore, a light beam (transmitted light beam) having passed through the small pinhole 22 of the first mask 20B turns into an ideal spherical wave.

As described above, a fourth diameter Rim of the small pinhole 34 of the second mask 30B satisfies relation (2).

Therefore, a light beam (transmitted light beam) having passed through the small pinhole 22 of the first mask 20B turns into an ideal spherical wave.

A distance db between the large pinhole 32 and small pinhole 34 of the second mask 30B satisfies inequality (5).

db>(the divergence, on the image plane, of a light beam having passed through the large pinhole 24 of the first mask 20B)+(the radius of the large pinhole 32 of the second mask 30B)  (5)

In other words, the second diameter of the large pinhole 24 of the first mask 20B and the third diameter of the large pinhole 32 of the second mask 30B are determined such that a light beam having passed through the large pinhole 24 does not enter the large pinhole 32. Furthermore, the third diameter of the large pinhole 32 of the second mask 30B is large enough to maintain information on the wavefront aberration of the optical system TOS to be measured.

The optical system TOS to be measured projects an image of the small pinhole 22a of the first mask 20B onto a large pinhole 32a of the second mask 30B, while it projects images of the large pinholes 24a and 24b of the first mask 20B onto small pinholes 34a and 34b of the second mask 30B. A light beam having passed through the small pinhole 22a of the first mask 20B and the large pinhole 32a of the second mask 30B has only information on the wavefront aberration of the optical system TOS to be measured. Light beams having passed through the large pinholes 24a and 24b of the first mask 20B and the small pinholes 34a and 34b of the second mask 30B turn into ideal spherical waves. When these three light beams interfere with each other on the detection unit 40, it is possible to obtain an interference pattern having four-fold symmetry. This interference pattern can be easily analyzed because its pitches are orthogonal to each other. An interference pattern with high contrast is obtained by a light beam having passed through the small pinhole 22a and light beams having passed through the large pinholes 24a and 24b of the first mask 20B, because they have high coherence. In this manner, light beams having passed through each small pinhole 22 and large pinholes 24 adjacent to it in the X and Y directions interfere with each other. Light beams having passed through the large pinholes 24a and 24b, for example, have low coherence and do not interfere with each other. Therefore, interference between the light beams having passed through the large pinholes 24a and 24b of the first mask 20B has no influence on the measurement accuracy.

The detection unit 40 detects a plurality of interference patterns each of which is formed by three light beams, that is, a light beam from the large pinhole 32a and light beams from the small pinholes 34a and 34b of the second mask 30B. On the detection unit 40, the three light beams form an interference pattern in which they are superposed on each other while being shifted in the X and Y directions by integer multiples of a distance 3db. The distance db between the large pinhole 32 and small pinhole 34 of the second mask 30B is sufficiently short, so the pinholes are densely formed. This makes it possible to increase the light quantity without deteriorating the measurement accuracy. Even though increasing the number of pinholes makes it possible to further increase the light quantity, the interference patterns are shifted and add up. As the pinhole formation range (area) widens, the contrast decreases. Hence, the range in which the pinholes (large pinholes 32 and small pinholes 34) of the second mask 30B are formed preferably falls within 1/10 the interference pattern pitch.

It is also possible to improve the measurement accuracy of the measurement apparatus 1B by forming two effective light source distributions as shown in FIGS. 16A and 16B or 17A and 17B using the illumination optical system 14, and illuminating the first mask 20B with these two effective light source distributions. More specifically, the coherence between a light beam having passed through the small pinhole 22a (large pinhole 32a) and a light beam having passed through the large pinhole 24b (small pinhole 34b) is increased using the effective light source distribution shown in FIG. 16A or 17A, thereby detecting their interference pattern. The coherence between the light beam having passed through the small pinhole 22a (large pinhole 32a) and a light beam having passed through the large pinhole 24a (small pinhole 34a) is increased using the effective light source distribution shown in FIG. 16B or 17B, thereby detecting their interference pattern. FIGS. 16A, 16B, 17A, and 17B are schematic plan views showing examples of the effective light source distribution formed by the illumination optical system 14.

Figure 18:
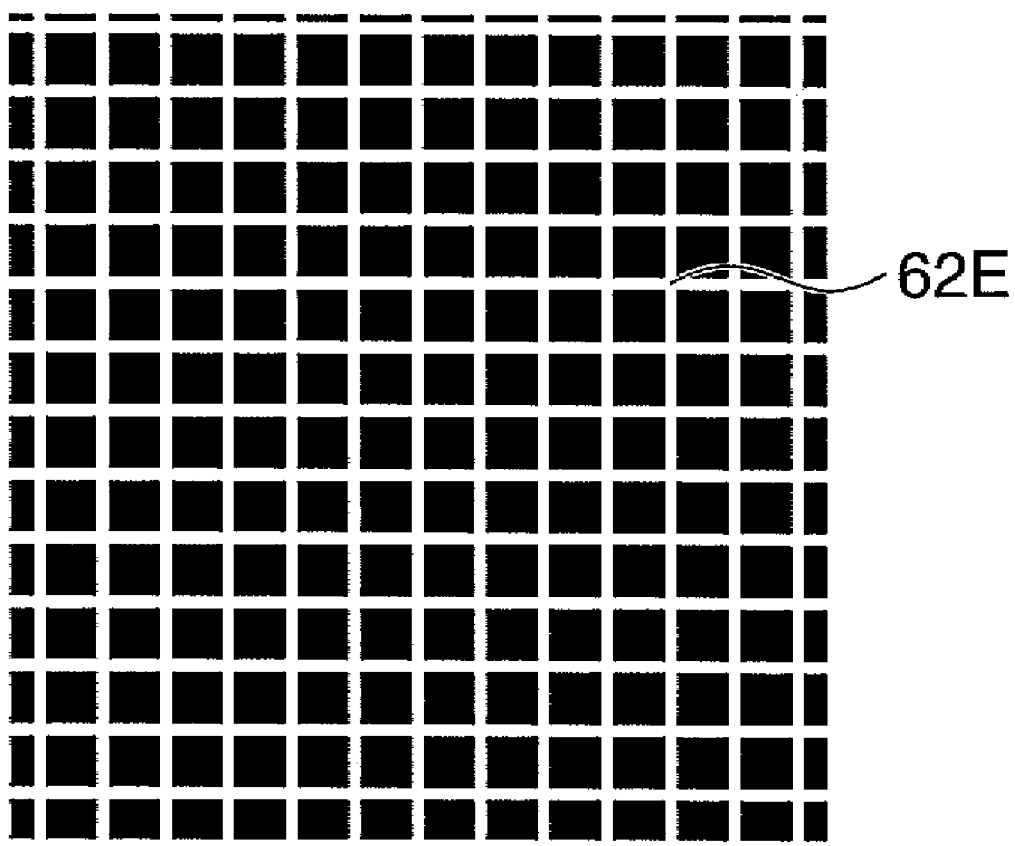
FIG. 18 is a schematic plan view showing a diffraction grating as an example of an optical division unit applicable to the measurement apparatus shown in FIG. 12.

As in the second embodiment, the coherence may be controlled by inserting a diffraction grating 60E serving as an optical division unit 60 as shown in FIG. 18 between the illumination optical system 14 and the first mask 20B, instead of using the effective light source distributions formed by the illumination optical system 14. The diffraction grating 60E has a transmitting portion 62E arranged such that only a light beam from each small pinhole 22 and light beams from large pinholes 24 adjacent to it in the X and Y directions of the small pinhole 22 have coherence. The pitch (diffraction grating pitch) Pg of the transmitting portion 62E of the diffraction grating 60E, and the distance Lg between the diffraction grating 60E and the first mask 20B satisfy relations (4) and (5), as described above. FIG. 18 is a schematic plan view showing the diffraction grating 60E as an example of the optical division unit 60.

When two diffraction gratings 60F and 60G shown in FIGS. 19A and 19B are interchangeably used (i.e., the diffraction gratings 60F and 60G are interchangeably arranged) as the optical division unit 60, it is possible to improve the measurement accuracy of the measurement apparatus 1B. More specifically, the coherence between a light beam having passed through the small pinhole 22a (large pinhole 32a) and a light beam having passed through the large pinhole 24b (small pinhole 34b) is increased using the diffraction grating 60F, thereby detecting their interference pattern. The coherence between the light beam having passed through the small pinhole 22a (large pinhole 32a) and a light beam having passed through the large pinhole 24a (small pinhole 34a) is increased using the diffraction grating 60G, thereby detecting their interference pattern. FIGS. 19A and 19B are schematic plan views showing the diffraction gratings 60F and 60G as an example of the optical division unit 60.

As in the first embodiment, to acquire the phase information of the wavefront aberration of the optical system TOS to be measured from an interference pattern obtained by the detection unit 40, an electronic moiré method or FFT method is used. For example, if the electronic moiré method is used, two types of electronic gratings in which slits run in the X and Y directions, respectively, are applied to the interference pattern. If the FFT method is used, peaks having four-fold symmetry appear on the Fourier space upon two-dimensionally Fourier-transforming the interference pattern. Information in the vicinities of two orthogonal peaks is used. With this operation, two wavefront aberrations are obtained. If no measurement error is generated at all, the two wavefront aberrations are equal to each other. In practice, however, the two wavefront aberrations are often different from each other due to a measurement error. The measurement error is preferably reduced by, for example, averaging the two wavefront aberrations.

As described above, the measurement apparatus 1B according to the third embodiment can accurately measure the optical performances (e.g., the wavefront aberration) of the optical system to be measured, in a short period of time with a simple arrangement.

Fourth Embodiment

Figure 20:
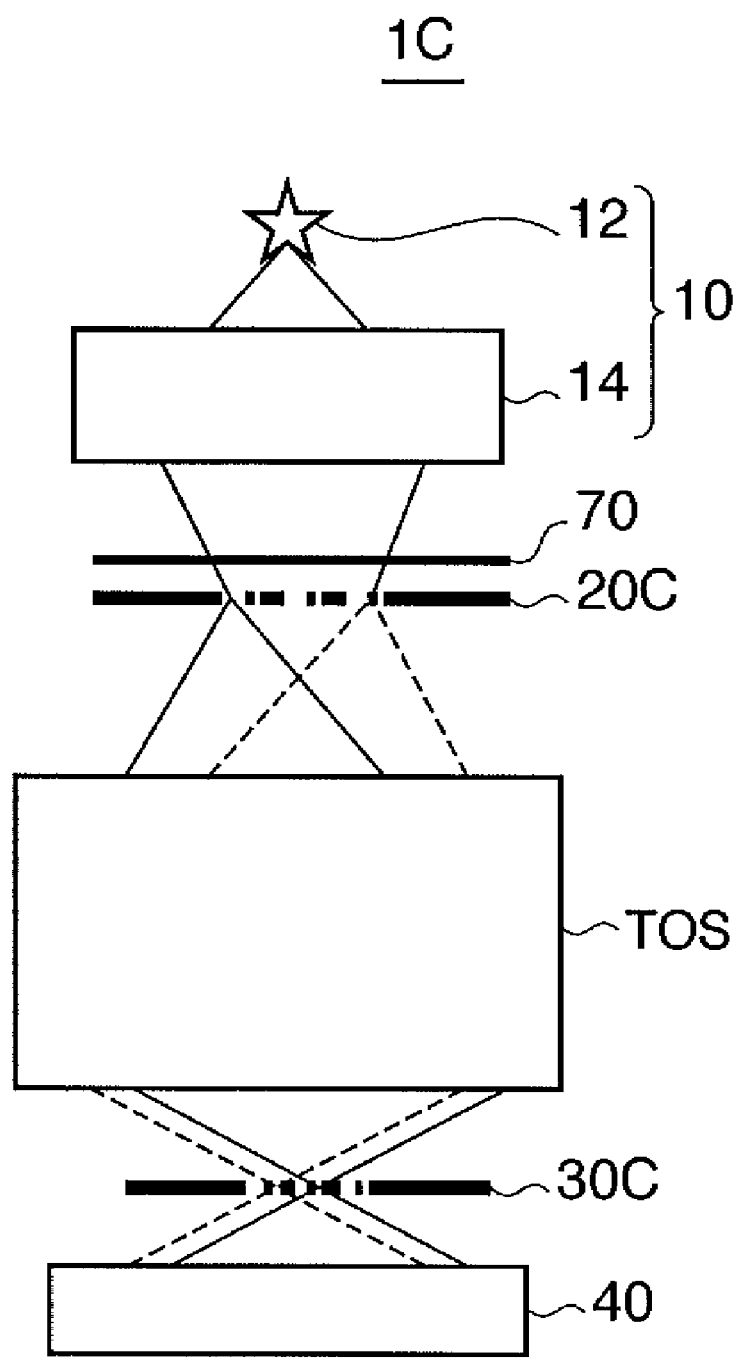
FIG. 20 is a schematic sectional view of a measurement apparatus according to one aspect of the present invention.

FIG. 20 is a schematic sectional view showing a measurement apparatus 1C according to the fourth embodiment of the present invention. The measurement apparatus 1C measures the optical performances of an optical system TOS to be measured. In this embodiment, the optical system TOS to be measured is a projection optical system used for an exposure apparatus, and the measurement apparatus 1C measures the wavefront aberration of the projection optical system. As shown in FIG. 20, the measurement apparatus 1C includes an illumination apparatus 10, first mask 20C, second mask 30C, detection unit 40, and phase shift mask 70.

Figure 21:
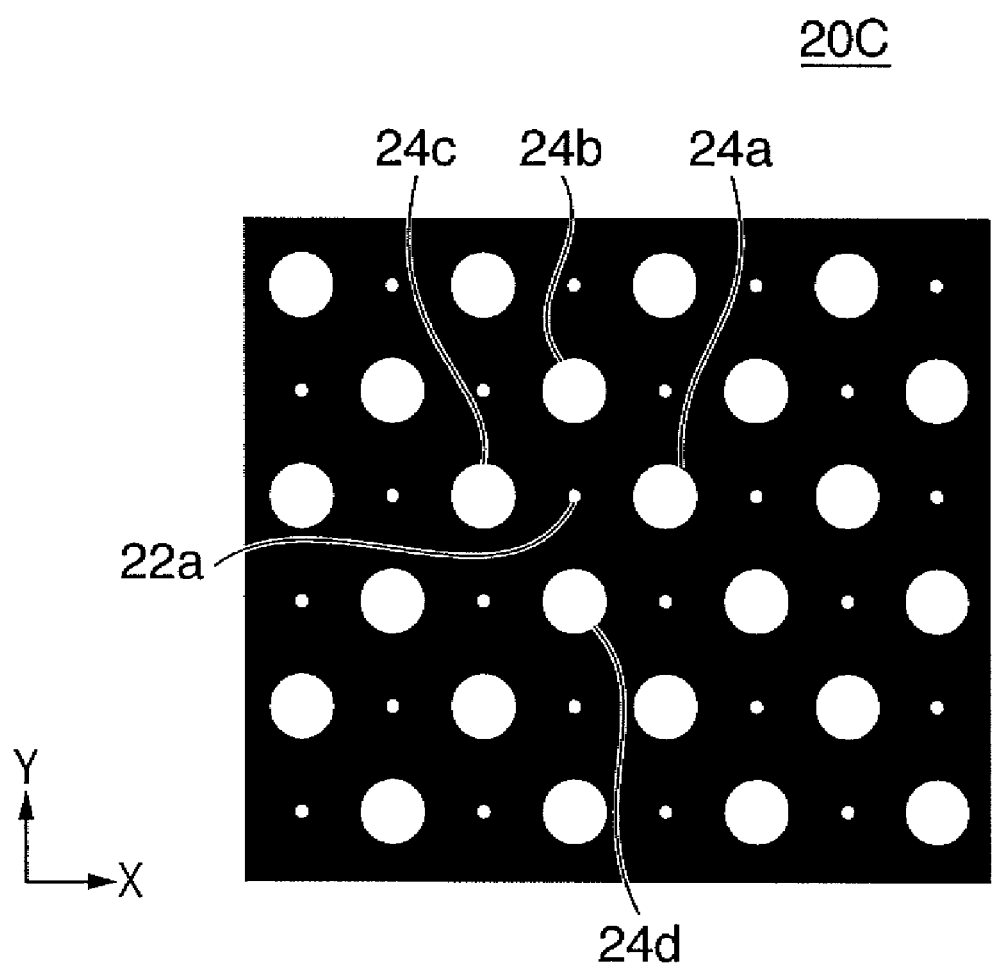
FIG. 21 is a schematic plan view of a first mask of the measurement apparatus shown in FIG. 20.
Figure 22:
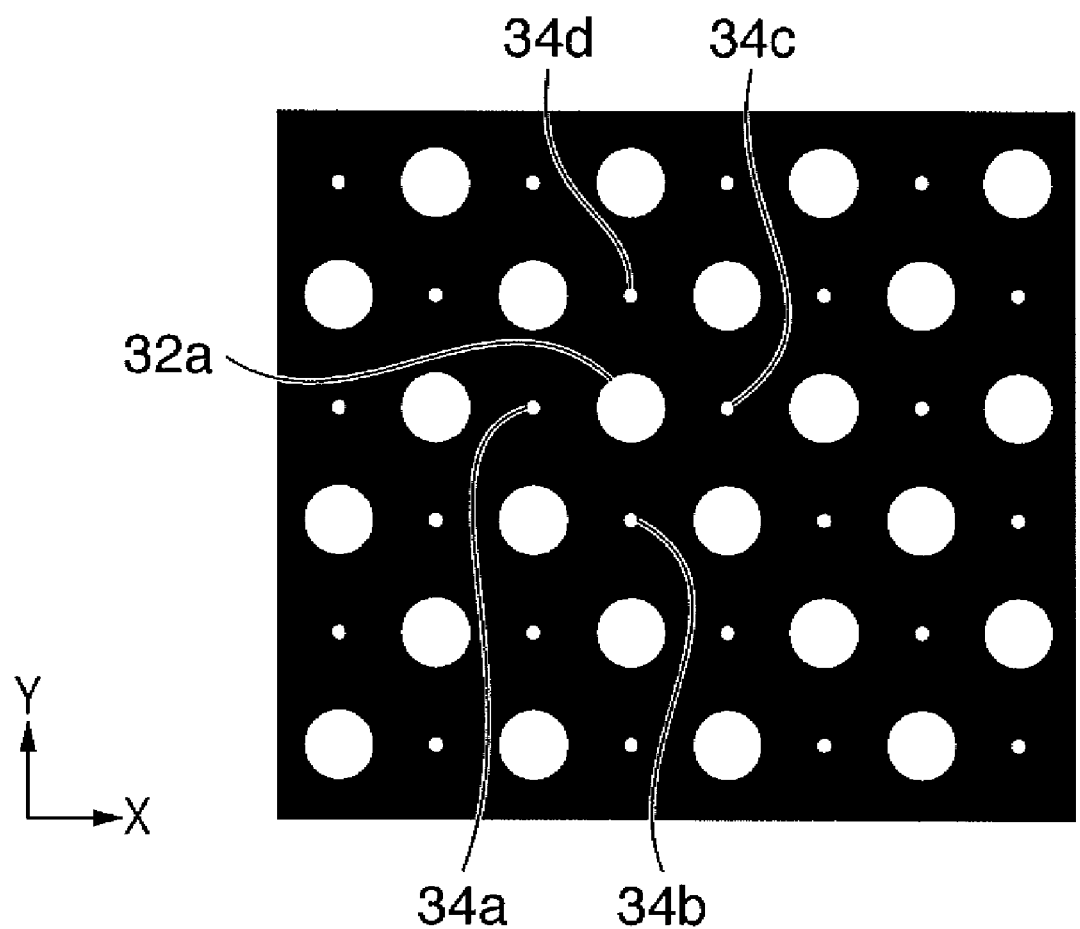
FIG. 22 is a schematic plan view of a second mask of the measurement apparatus shown in FIG. 20.

As shown in FIG. 21, the first mask 20C has a plurality of small pinholes 22 and a plurality of large pinholes 24. On the other hand, as shown in FIG. 22, the second mask 30C has a plurality of large pinholes 32 and a plurality of small pinholes 34 formed in correspondence with the plurality of small pinholes 22 and the plurality of large pinholes 24 of the first mask 20C. FIG. 21 is a schematic plan view showing the arrangement of the first mask 20C. FIG. 22 is a schematic plan view showing the arrangement of the second mask 30C.

The illumination apparatus 10 (an illumination optical system 14), the first mask 20C, and the second mask 30C will be explained in detail below.

The illumination apparatus 10 will be explained first. The illumination apparatus 10 adjusts the effective light source distribution using the illumination optical system 14 to control the coherence length and coherence direction of light beams having passed through the first mask 20C (small pinholes 22 and large pinholes 24) such that only desired light beams interfere with each other. In the fourth embodiment, the illumination optical system 14 forms the effective light source distributions shown in FIGS. 15A to 15C and illuminates a desired position on the first mask 20C in the X and Y directions with light beams having high coherence. Only a light beam having passed through a small pinhole $22a$ and light beams having passed through large pinholes $24a$ and $24b$ have coherence, and only the light beam having passed through the small pinhole $22a$ and light beams having passed through large pinholes $24c$ and $24d$ have coherence.

The first mask 20C and second mask 30C will be explained next. As described above, a first diameter Rob of the small pinhole 22 of the first mask 20C satisfies relation (1). Therefore, a light beam (transmitted light beam) having passed through the small pinhole 22 of the first mask 20C turns into an ideal spherical wave.

As described above, a fourth diameter Rim of the small pinhole 34 of the second mask 30C satisfies relation (2). Therefore, a light beam (transmitted light beam) having passed through the small pinhole 22 of the first mask 20C turns into an ideal spherical wave.

A distance dc between the large pinhole 32 and small pinhole 34 of the second mask 30C satisfies inequality (6).

dc>(the divergence, on the image plane, of a light
beam having passed through the large pinhole 24
of the first mask 20C)+(the radius of the large
pinhole 32 of the second mask 30C)                    (6)

In other words, the second diameter of the large pinhole 24 of the first mask 20C and the third diameter of the large pinhole 32 of the second mask 30C are determined such that a light beam having passed through the large pinhole 24 does not enter the large pinhole 32. Furthermore, the third diameter of the large pinhole 32 of the second mask 30C is large enough to maintain information on the wavefront aberration of the optical system TOS to be measured.

The optical system TOS to be measured projects an image of the small pinhole $22a$ of the first mask 20C onto a large pinhole $32a$ of the second mask 30C, while it projects images of the large pinholes $24a$ to $24d$ of the first mask 20C onto small pinholes $34a$ to $34d$ of the second mask 30C. A light beam having passed through the small pinhole $22a$ of the first mask 20C and the large pinhole $32a$ of the second mask 30C has only information on the wavefront aberration of the optical system TOS to be measured. Light beams having passed through the large pinholes $24a$ to $24d$ of the first mask 20C and the small pinholes $34a$ to $34d$ of the second mask 30C turn into ideal spherical waves. When these five light beams interfere with each other on the detection unit 40, it is possible to obtain an interference pattern. An interference pattern with high contrast is obtained by a light beam having passed through the small pinhole $22a$ and light beams having passed through the large pinholes $24a$ to $24d$ of the first mask 20C, because they have high coherence. In this manner, light beams having passed through each small pinhole 22 and large pinholes 24 adjacent to it in the X and Y directions interfere with each other. Light beams having passed through the large pinholes $24a$ and $24b$, for example, have low coherence and do not interfere with each other. Therefore, interference between the light beams having passed through the large pinholes $24a$ and $24b$ of the first mask 20C has no influence on the measurement accuracy.

The detection unit 40 detects a plurality of interference patterns each of which is formed by five light beams, that is, a light beam from the large pinhole $32a$ and light beams from the small pinholes $34a$ to $34d$ of the second mask 30C. On the detection unit 40, the five light beams form an interference pattern in which they are superposed on each other while being shifted in the X and Y directions by integer multiples of a distance 2dc. The distance dc between the large pinhole 32 and small pinhole 34 of the second mask 30C is sufficiently short, so the pinholes are densely formed. This makes it possible to increase the light quantity without deteriorating the measurement accuracy. Even though increasing the number of pinholes makes it possible to further increase the light quantity, the interference patterns are shifted and add up. As the pinhole formation range (area) widens, the contrast decreases. Hence, the range in which the pinholes (large pinholes 32 and small pinholes 34) of the second mask 30C are formed preferably falls within 1/10 the interference pattern pitch.

Figure 23:
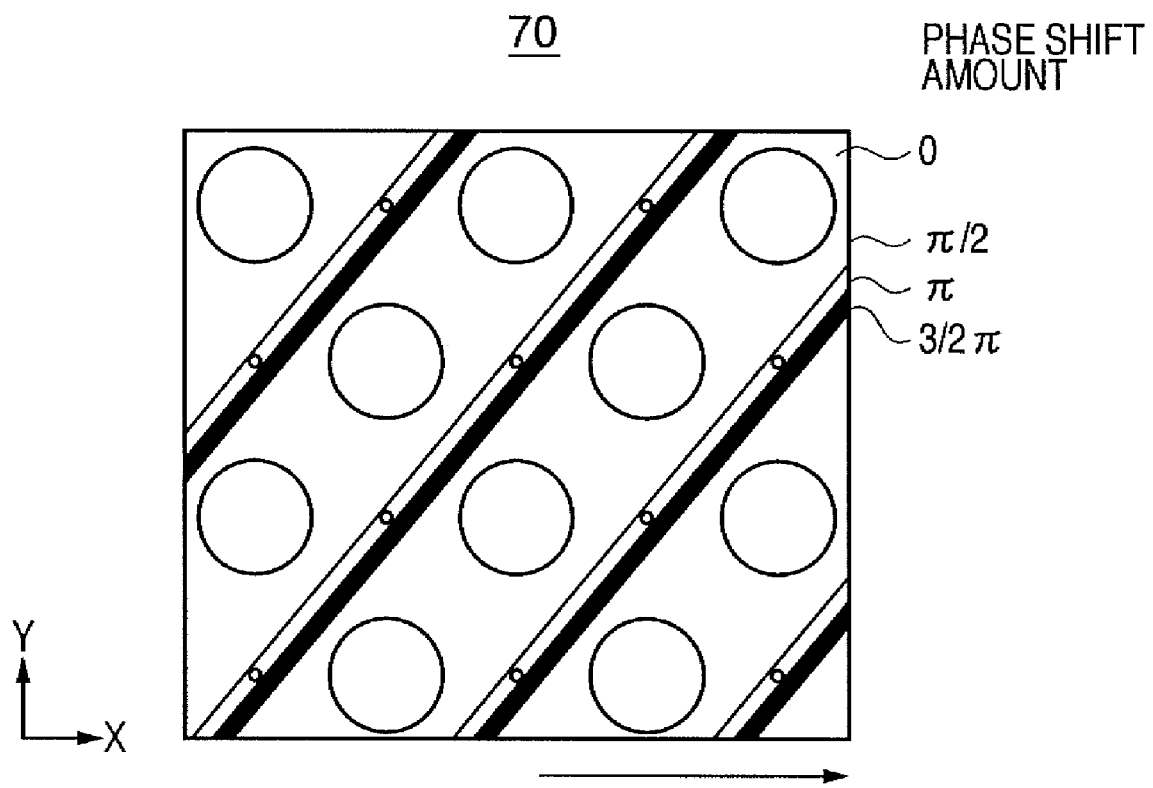
FIG. 23 is a schematic plan view of a phase shift mask of the measurement apparatus shown in FIG. 20.

To acquire the phase information of the wavefront aberration of the optical system TOS to be measured from an interference pattern obtained by the detection unit 40, a fringe scan method is used in the fourth embodiment in place of the electronic moiré method and FFT method. The measurement apparatus 1C has, on the incident side of the first mask 20C, the phase shift mask 70 for shifting the phase of only a light beam from the small pinhole 22 of the first mask 20C. For example, as shown in FIG. 23, the phase shift mask 70 has a region in which the phase of a light beam is shifted in the 45° direction with respect to the X-axis by 0, $\frac{1}{2}\pi$, $\pi$, and $\frac{3}{2}\pi$. When the phase shift mask 70 is driven on the first mask 20C in a predetermined direction, it is possible to change the relative phase difference between light beams which enter the small pinhole 22 and the large pinhole 24. FIG. 23 is a schematic plan view showing the arrangement of the phase shift mask 70.

As described above, the measurement apparatus 1C according to the fourth embodiment can accurately measure the optical performances (e.g., the wavefront aberration) of the optical system to be measured, in a short period of time with a simple arrangement.

Fifth Embodiment

Figure 24:
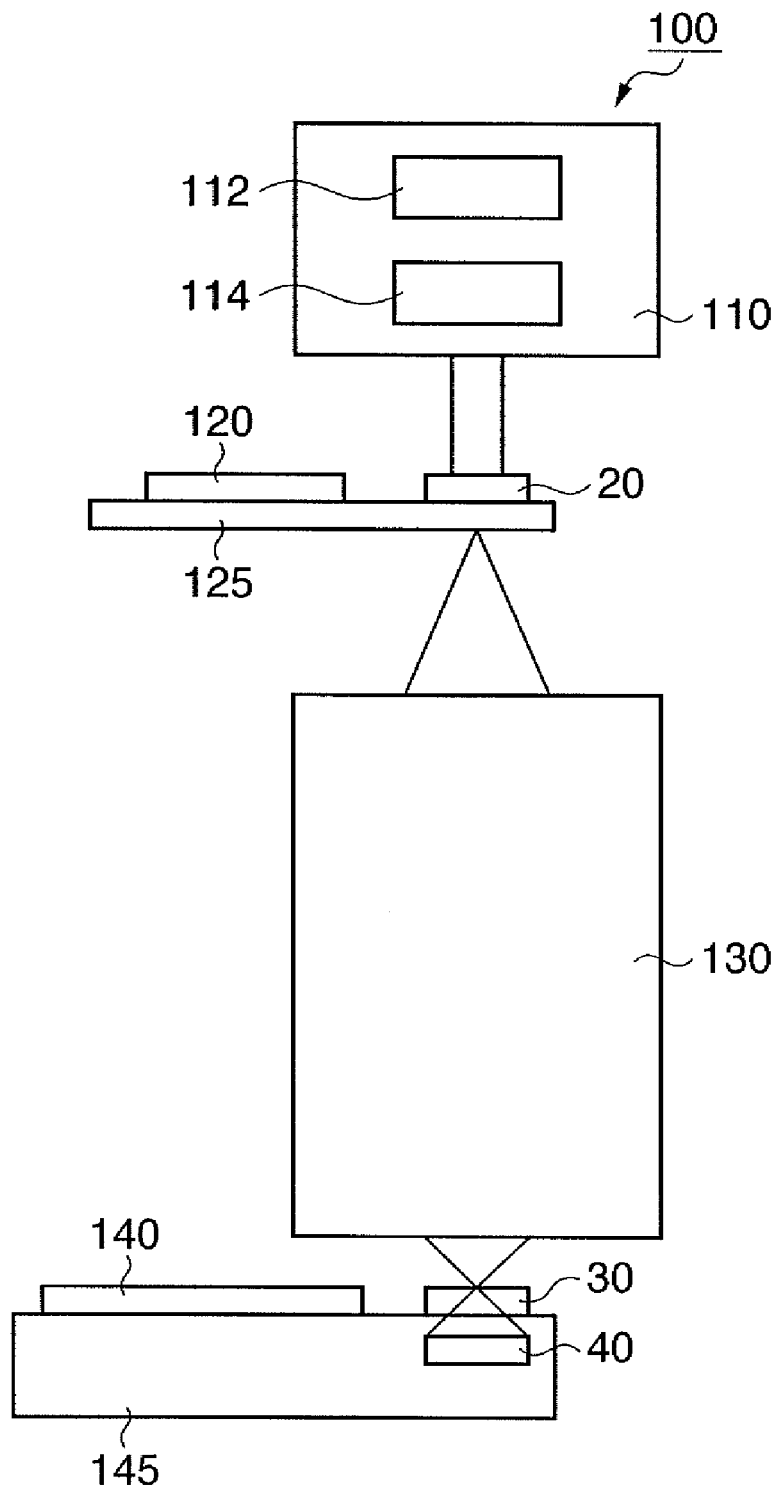
FIG. 24 is a schematic sectional view of an exposure apparatus according to one aspect of the present invention.

An exposure apparatus to which the measurement apparatuses 1 to 1C according to the first to fourth embodiments are applied will be explained below. FIG. 24 is a schematic sectional view showing an exposure apparatus 100 according to one aspect of the present invention. In this embodiment, the exposure apparatus 100 is a projection exposure apparatus which transfers the pattern of a reticle 120 onto a wafer 140 by exposure using a step & scan scheme. However, the exposure apparatus 100 can also adopt a step & repeat scheme. The exposure apparatus 100 includes an illumination apparatus 110, a reticle stage 125 which supports the reticle 120 and a first mask 20, a projection optical system 130, a wafer stage 145 which supports the wafer 140 and a second mask 30, and a detection unit 40. In the exposure apparatus 100, the illumination apparatus 110 (an illumination optical system 114), first mask 20, second mask 30, and detection unit 40 constitute the measurement apparatus 1 according to the above-described first embodiment. This embodiment will exemplify a case in which the measurement apparatus 1 is applied to the exposure apparatus 100.

The illumination apparatus 110 illuminates the first mask 20 and the reticle 120 on which a circuit pattern to be transferred is formed, and includes a light source unit 112 and the illumination optical system 114. The illumination apparatus 110, light source unit 112, and illumination optical system 114 have the same arrangements and functions as the above-described illumination apparatus 10, light source unit 12, and illumination optical system 14, and a detailed description thereof will not be repeated.

The reticle 120 has a circuit pattern and is supported and driven by the reticle stage 125. Diffracted light generated by the reticle 120 is projected onto the wafer 140 via the projection optical system 130. Since the exposure apparatus 100 is of a step & scan scheme, it scans the reticle 120 and wafer 140 to transfer the pattern of the reticle 120 onto the wafer 140.

The reticle stage 125 supports the reticle 120 and first mask 20 and connects to a moving mechanism (not shown). The moving mechanism (not shown) includes, for example, a linear motor and drives the reticle stage 125 so as to move the reticle 120 and first mask 20.

The projection optical system 130 projects the pattern of the reticle 120 onto the wafer 140. The measurement apparatus which includes the illumination apparatus 110, first mask 20, second mask 30, and detection unit 40 accurately measures the wavefront aberration of the projection optical system 130. The wavefront aberration is adjusted based on the measurement result.

In this embodiment, the wafer 140 is used as the substrate. It is also possible to use other substrates such as a glass plate in place of the wafer 140. The wafer 140 is coated with a photoresist.

The wafer stage 145 supports the wafer 140 and second mask 30 and drives them using, for example, a linear motor.

The first mask 20, second mask 30, and detection unit 40 which constitute the measurement apparatus for measuring the wavefront aberration of the projection optical system 130 can take any form as described above, and a detailed description thereof (arrangement and measurement operation) will be omitted here.

First, the exposure apparatus 100 measures the wavefront aberration of the projection optical system 130. As described above, the wavefront aberration of the projection optical system 130 is measured using the illumination apparatus 110, first mask 20, second mask 30, and detection unit 40 which constitute the measurement apparatus 1. As the wavefront aberration of the projection optical system 130 is measured, it is adjusted based on the measurement result. As described above, the measurement apparatus 1 can accurately measure the wavefront aberration of the projection optical system 130 so as to accurately adjust it.

The pattern of the reticle 120 is then transferred onto the wafer 140 by exposure. The illumination optical system 114 illuminates the reticle 120 with a light beam emitted by the light source unit 112. The projection optical system 130 images the light beam which reflects the pattern of the reticle 120 on the wafer 140. As described above, since the wavefront aberration of the projection optical system 130 used for the exposure apparatus 100 is accurately adjusted, an excellent imaging capability is attained. Hence, the exposure apparatus 100 can provide devices (e.g., a semiconductor device, an LCD device, an image sensing device (e.g., a CCD), and a thin-film magnetic head) with high throughput, high quality, and a good economical efficiency.

Sixth Embodiment

Figure 25:
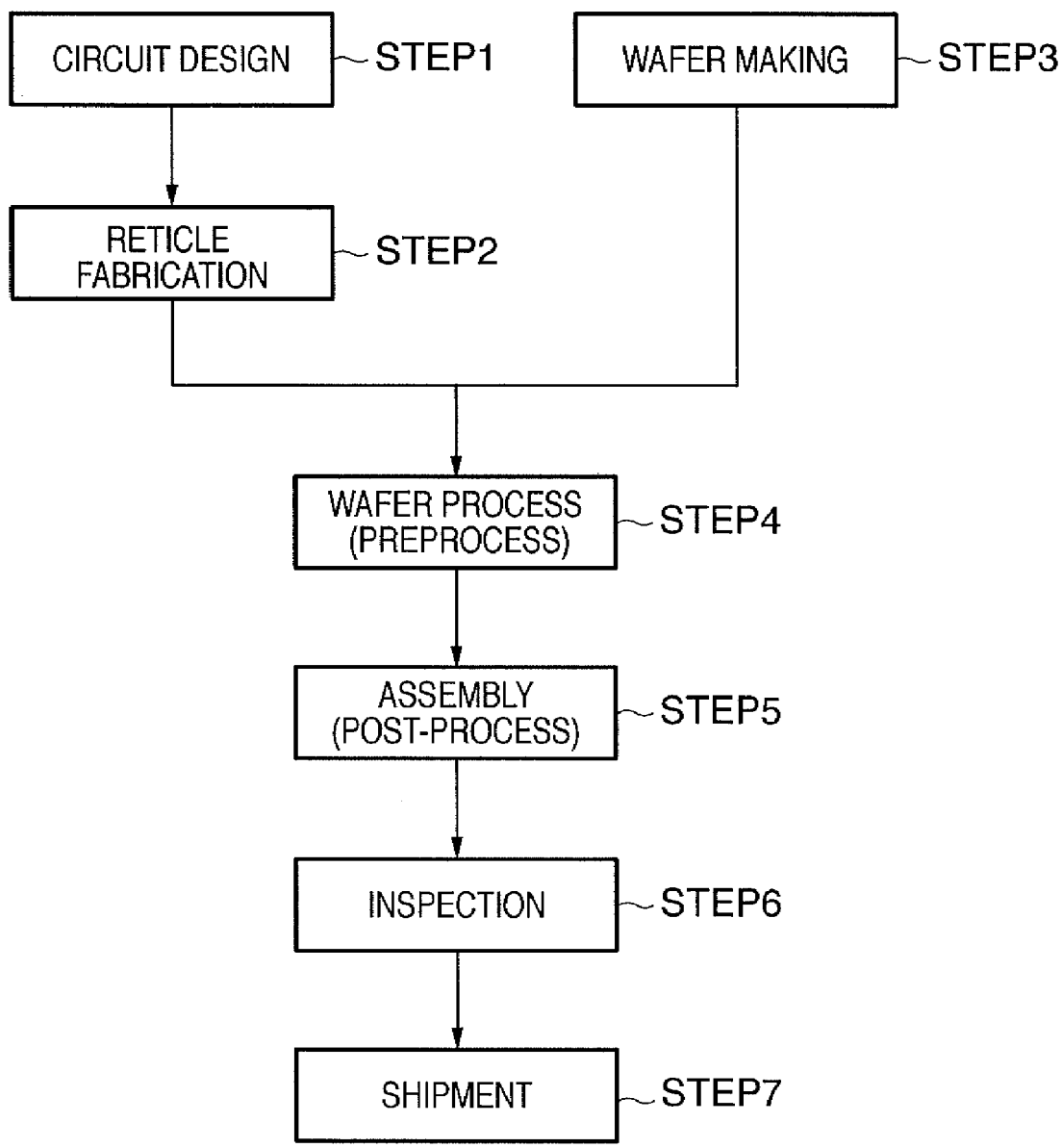
FIG. 25 is a flowchart for explaining a method for fabricating devices.
Figure 26:
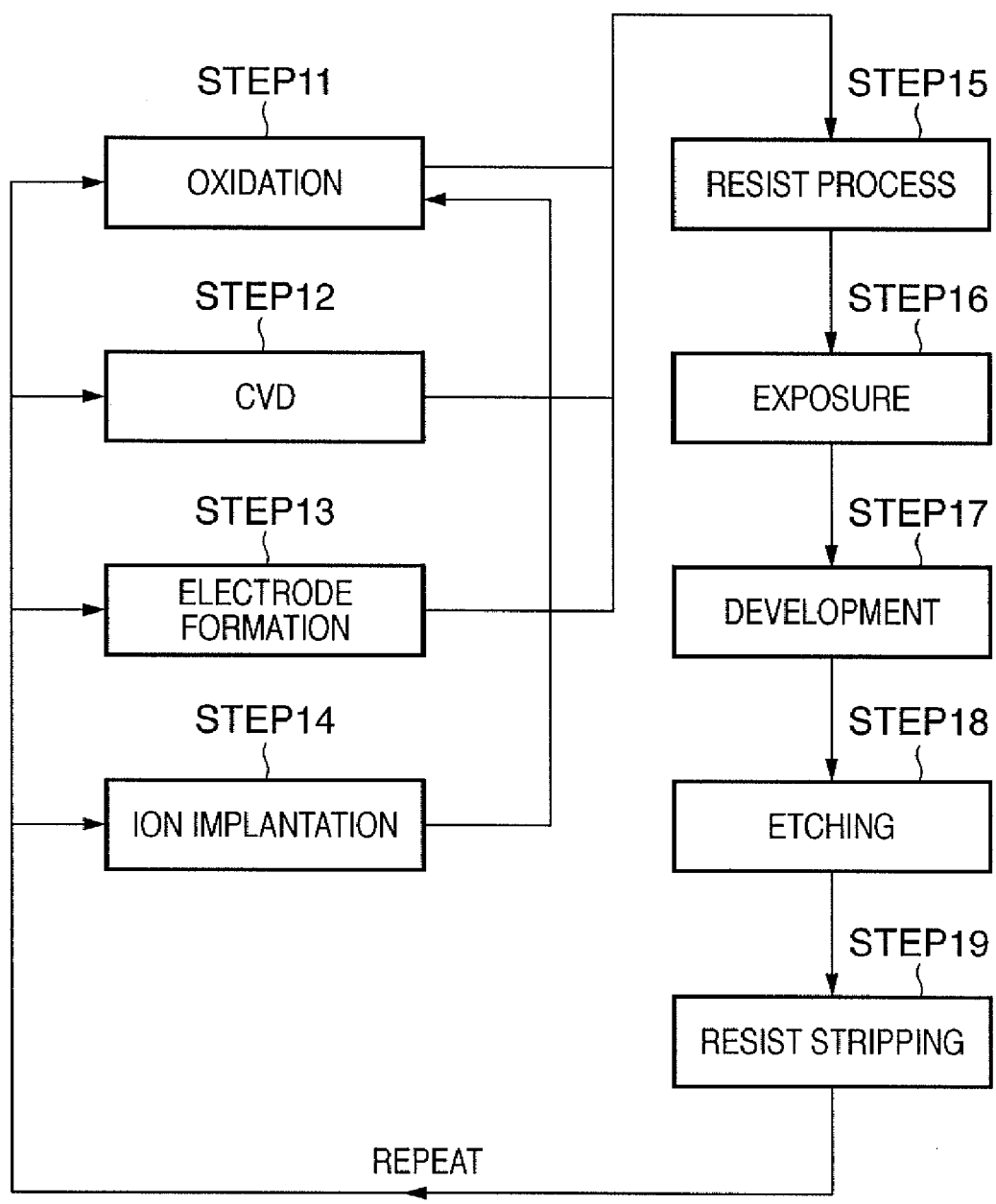
FIG. 26 is a detail flowchart of a wafer process in Step 4 of FIG. 25.

Referring now to FIGS. 25 and 26, a description will be given of an embodiment of a device fabrication method using the above mentioned exposure apparatus 100. FIG. 25 is a flowchart for explaining how to fabricate devices (i.e., semiconductor chips such as IC and LSI, LCDs, CCDs, and the like). Here, a description will be given of the fabrication of a semiconductor chip as an example. Step 1 (circuit design) designs a semiconductor device circuit. Step 2 (reticle fabrication) forms a reticle having a designed circuit pattern. Step 3 (wafer making) manufactures a wafer using materials such as silicon. Step 4 (wafer process), which is also referred to as a pretreatment, forms the actual circuitry on the wafer through lithography using the reticle and wafer. Step 5 (assembly), which is also referred to as a post-treatment, forms into a semiconductor chip the wafer formed in Step 4 and includes an assembly step (e.g., dicing, bonding), a packaging step (chip sealing), and the like. Step 6 (inspection) performs various tests on the semiconductor device made in Step 5, such as a validity test and a durability test. Through these steps, a semiconductor device is finished and shipped (Step 7).

FIG. 26 is a detailed flowchart of the wafer process in Step 4. Step 11 (oxidation) oxidizes the wafer's surface. Step 12 (CVD) forms an insulating layer on the wafer's surface. Step 13 (electrode formation) forms electrodes on the wafer by vapor disposition and the like. Step 14 (ion implantation) implants ions into the wafer. Step 15 (resist process) applies a photosensitive material onto the wafer. Step 16 (exposure) uses the exposure apparatus 100 to expose a circuit pattern from the reticle onto the wafer. Step 17 (development) develops the exposed wafer. Step 18 (etching) etches parts other than a developed resist image. Step 19 (resist stripping) removes unused resist after etching. These steps are repeated to form multi-layer circuit patterns on the wafer. The device fabrication method of this embodiment may manufacture higher quality devices than the conventional one. Thus, the device fabrication method using the exposure apparatus 100, and resultant devices constitute one aspect of the present invention.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese patent application No. 2007-026071 filed on Feb. 5, 2007, which is hereby incorporated by reference herein in its entirety.

What is claimed is:

1. A measurement apparatus which measures a wavefront aberration of an optical system to be measured, the apparatus comprising:
a detection unit configured to detect an interference pattern formed by light having passed through a mask inserted on an object plane of the optical system to be measured, and a mask inserted on an image plane of the optical system to be measured, wherein
a plurality of first pinholes each of which has a first diameter and which are spaced apart from each other by a distance at which said plurality of first pinholes do not have coherence, and a plurality of second pinholes each of which has a second diameter larger than the first diameter and is spaced apart from a corresponding one of said plurality of first pinholes by a distance at which said each first pinhole and said corresponding second pinhole have coherence are formed in the mask inserted on the object plane of the optical system to be measured, and
a plurality of third pinholes each of which has a third diameter and which are formed to receive light beams having passed through said plurality of first pinholes and the optical system to be measured, and a plurality of fourth pinholes each of which has a fourth diameter smaller than the third diameter and which are formed to receive light beams having passed through said plurality of second pinholes and the optical system to be measured are formed in the mask inserted on the image plane of the optical system to be measured.

2. The apparatus according to claim 1, wherein said plurality of first pinholes and said plurality of second pinholes are periodically, two-dimensionally formed.

3. The apparatus according to claim 1, wherein said plurality of first pinholes are formed at intersections among a plurality of first virtual lines running parallel to a first direction at a first interval, a plurality of second virtual lines running parallel to a second direction, which forms an angle of 60° with said first virtual line, at the first interval, and a plurality of third virtual lines running parallel to a third direction, which forms an angle of 60° with said first virtual line and is different from the second direction, at the first interval, and
each of said plurality of second pinholes is formed at a position of the center of gravity of one of equilateral triangles which are formed by the intersections and oriented in two directions.

4. The apparatus according to claim 1, further comprising an illumination optical system configured to illuminate said mask inserted on the object plane of the optical system to be measured,
wherein said illumination optical system forms an effective light source distribution in which only a light beam from said first pinhole and a light beam from said second pinhole adjacent to said first pinhole have coherence.

5. The apparatus according to claim 1, further comprising a division unit which is inserted on an incident side of said mask inserted on the object plane of the optical system to be measured and is configured to split a light beam which illuminates said mask inserted on the object plane of the optical system to be measured.

6. The apparatus according to claim 5, wherein said division unit includes a diffraction grating having a transmitting portion which is two dimensionally arranged such that only a light beam from said first pinhole and a light beam from said second pinhole adjacent to said first pinhole have coherence.

7. An exposure apparatus comprising:
an illumination optical system configured to illuminate a reticle with a light beam from a light source;
a projection optical system configured to project a pattern of the reticle onto a substrate; and
a measurement apparatus configured to measure a wavefront aberration of said projection optical system as an optical system to be measured,
wherein said measurement apparatus includes a measurement apparatus according to claim 1.

8. A device fabrication method comprising steps of:
exposing a substrate using an exposure apparatus according to claim 7; and
performing a development process for the substrate exposed.

* * * * *